United States Patent
Swoboda

(10) Patent No.: US 7,783,925 B2
(45) Date of Patent: Aug. 24, 2010

(54) RECEIVING CONTROL, DATA, AND CONTROL SEGMENTS OF COMMUNICATION SCAN PACKETS

(75) Inventor: Gary L. Swoboda, Sugar Land, TX (US)

(73) Assignee: Texas Instruments Incorporated, Dallas, TX (US)

(*) Notice: Subject to any disclaimer, the term of this patent is extended or adjusted under 35 U.S.C. 154(b) by 860 days.

(21) Appl. No.: 11/423,702

(22) Filed: Jun. 12, 2006

(65) Prior Publication Data

US 2006/0279439 A1 Dec. 14, 2006

Related U.S. Application Data

(63) Continuation of application No. 11/351,443, filed on Feb. 9, 2006, and a continuation-in-part of application No. 11/293,067, filed on Dec. 2, 2005, now Pat. No. 7,761,762, and a continuation-in-part of application No. 11/292,598, filed on Dec. 2, 2005, and a continuation-in-part of application No. 11/293,599, filed on Dec. 2, 2005, and a continuation-in-part of application No. 11/292,597, filed on Dec. 2, 2005, now Pat. No. 7,571,366, and a continuation-in-part of application No. 11/292,703, filed on Dec. 2, 2005.

(60) Provisional application No. 60/689,381, filed on Jun. 10, 2005, provisional application No. 60/676,603, filed on Apr. 29, 2005, provisional application No. 60/632,640, filed on Dec. 2, 2004, provisional application No. 60/663,827, filed on Mar. 21, 2005.

(51) Int. Cl.
*G06F 11/00* (2006.01)

(52) U.S. Cl. ........................................ 714/30; 714/727

(58) Field of Classification Search .................. 714/30, 714/727
See application file for complete search history.

(56) References Cited

U.S. PATENT DOCUMENTS

| 5,103,450 | A | * | 4/1992 | Whetsel | 714/724 |
| 5,706,297 | A | * | 1/1998 | Jeppesen et al. | 714/30 |
| 5,708,773 | A | * | 1/1998 | Jeppesen et al. | 714/30 |
| 2001/0037480 | A1 | * | 11/2001 | Whetsel | 714/727 |
| 2002/0133795 | A1 | * | 9/2002 | Yamada | 716/4 |
| 2002/0188782 | A1 | * | 12/2002 | Fay | 710/110 |
| 2005/0160337 | A1 | * | 7/2005 | Whetsel | 714/726 |

OTHER PUBLICATIONS

Swoboda, Gary L., "Compact JTAG (cJTAG)," Revision 0.9, Nov. 20, 2005.

* cited by examiner

*Primary Examiner*—Philip Guyton
(74) *Attorney, Agent, or Firm*—Lawrence J. Bassuk; W. James Brady; Frederick J. Telecky, Jr.

(57) ABSTRACT

A system and method for improved performance and optimization of data exchanges over a communications link is described, including a method for communicating data that includes transmitting a first control segment of a message from a first system to a second system (the first control segment including control information that selects an active communications protocol from a plurality of communications protocols); sequencing at least part of the first and second systems through a series of states that control the active communications protocol based upon the control information in the first control segment; and exchanging a data segment of the message (after the first control segment) between the first system and the second system. The series of states represents inert sequences to the remaining communications protocols of the plurality of communications protocols that were not selected as active.

4 Claims, 27 Drawing Sheets

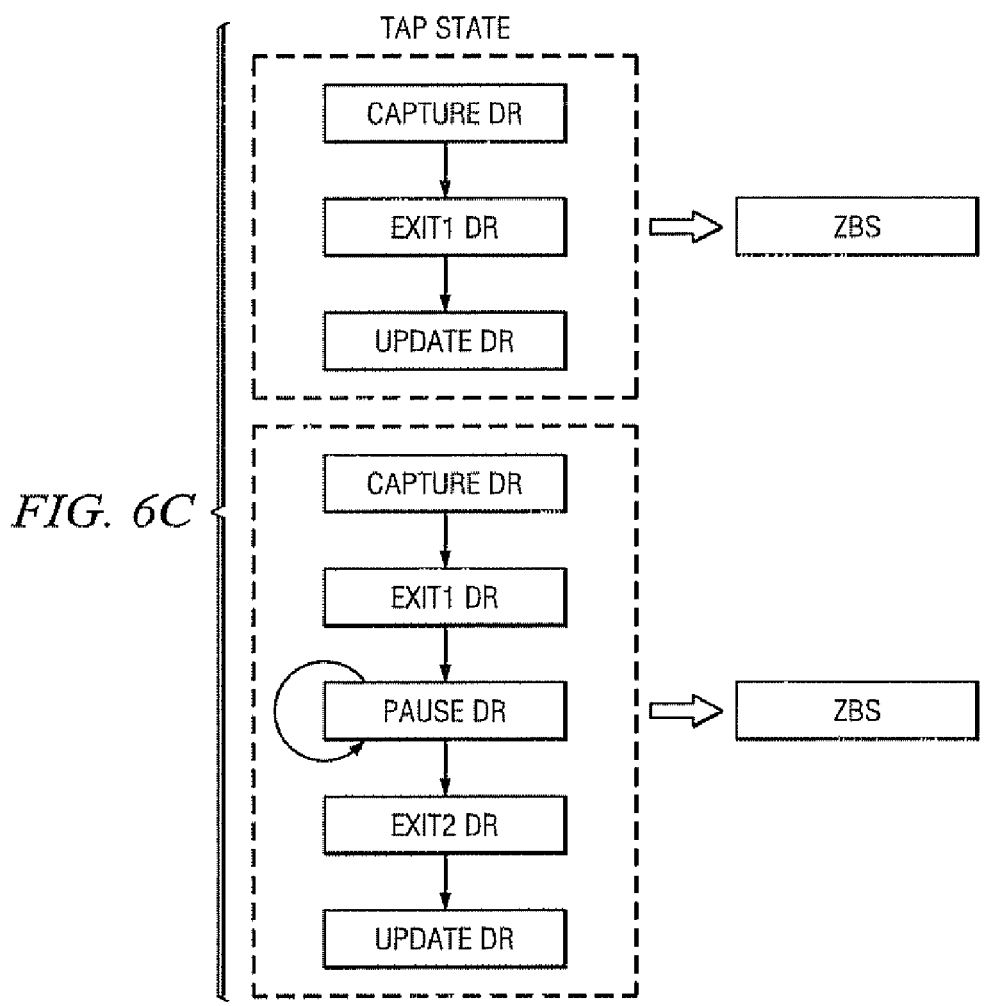

FIG. 6C

| LEVEL | TYPE | DESCRIPTION |
|---|---|---|
| 0 | PUBLIC | COMMAND WINDOW IS CLOSED, DR SCANS OPERATE NORMALLY |
| 1 | PUBLIC | CDX TRANSFERS USE THE Shift_DR STATE IF CDX IS ENABLED, ELSE DR SCANS OPERATE NORMALLY |
| 2 | PUBLIC | cJTAG CONTROL REGISTERS MAY BE CHANGED BY COMMAND SEQUENCES. DATA TRANSFERS TO THE DTS FUNCTION NORMALLY IN STANDARD AND ADVANCED MODES. |
| 3 | PUBLIC | cJTAG CONTROL REGISTERS MAY BE CHANGED BY COMMAND SEQUENCES. TDO REMAINS IN A HI-z STATE IN STANDARD MODE. READ DATA IS ALWAYS A ONE IN ADVANCED MODE |
| 4-5 | PUBLIC | RESERVED |
| 6 AND ABOVE | PRIVATE | USER DEFINED |

FIG. 8A

| SCAN COUNT | MNEMONIC | DESCRIPTION |
|---|---|---|
| 0 | SCA | STORE CONTROL ACTION |
| 1 | MSS | MAKE SCAN SELECTION |
| 2 | MTS | MAKE TRANSPORT SELECTION |
| 3 | SLID | STORE LINK ID |
| 4 | ILID | INVALIDATE LINK ID |
| 5 | STF | STORE TRANSPORT FORMAT |
| 6 | SSF | STORE SCAN FORMAT |
| 7 | SRS | STATUS READ/SERIAL SELECT |
| 8 | XPE | TRANSPORT ENABLE |
| 9 | rsv0 | RESERVED FOR cJTAG EXTENSIONS |
| 10 | LECP | LOAD EXTENDED COMMAND PAGE |
| 11 | RECP | READ EXTENDED COMMAND PAGE |
| 12 | EXC0 | EXTENDED COMMAND 0 (USER DEFINED) |
| 13 | EXC1 | EXTENDED COMMAND 1 (USER DEFINED) |
| 14 | EXC2 | EXTENDED COMMAND 2 (USER DEFINED) |
| 15 | EXC3 | EXTENDED COMMAND 3 (USER DEFINED) |
| 16-31 | LTR | LOAD TEMP REGISTER |

*FIG. 8B*

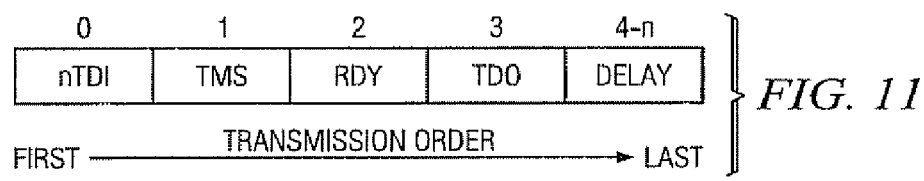

*FIG. 11*

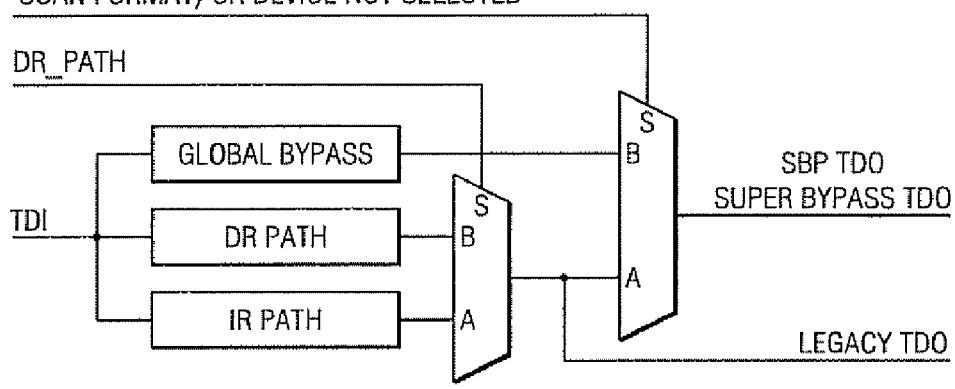

*FIG. 18*

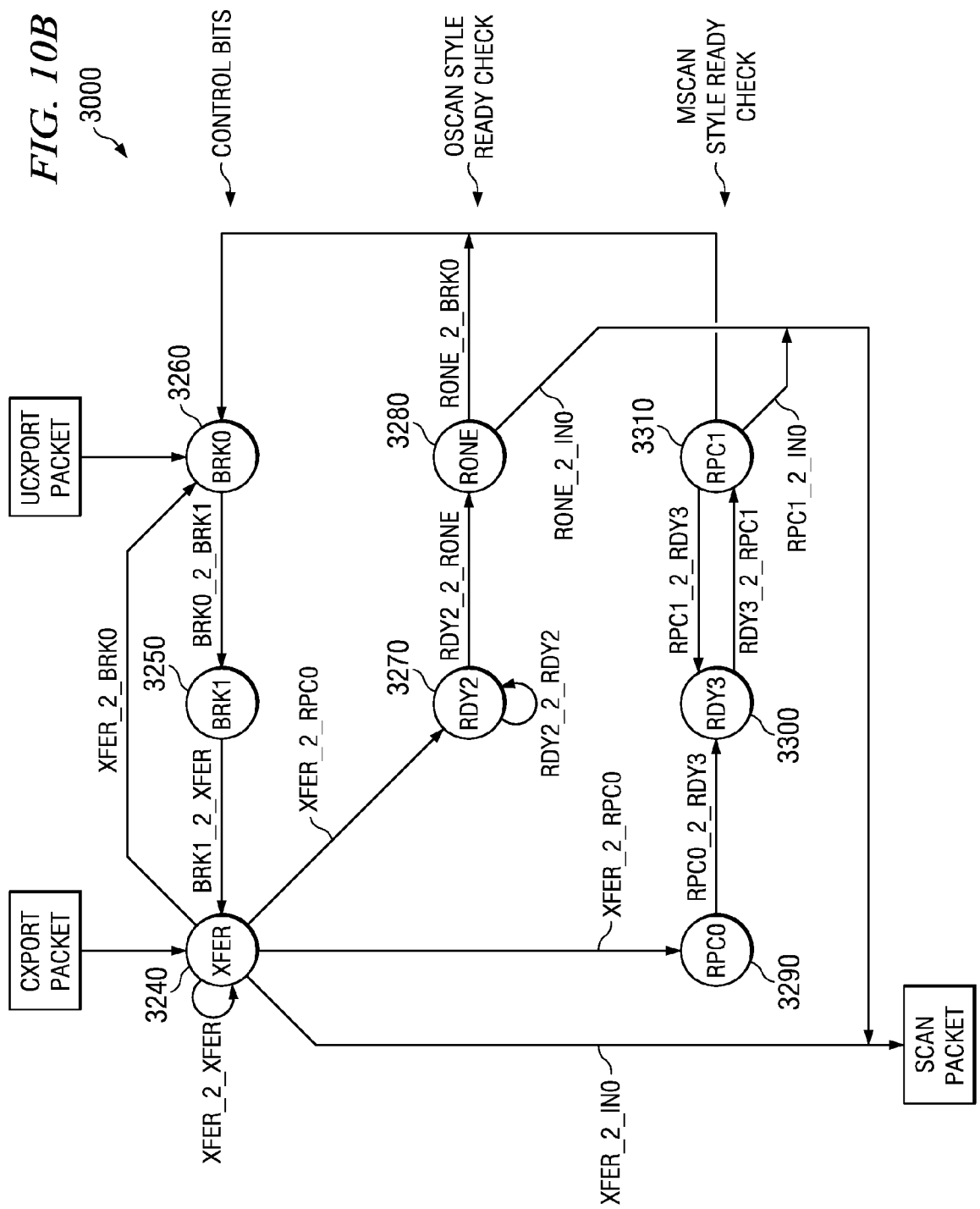

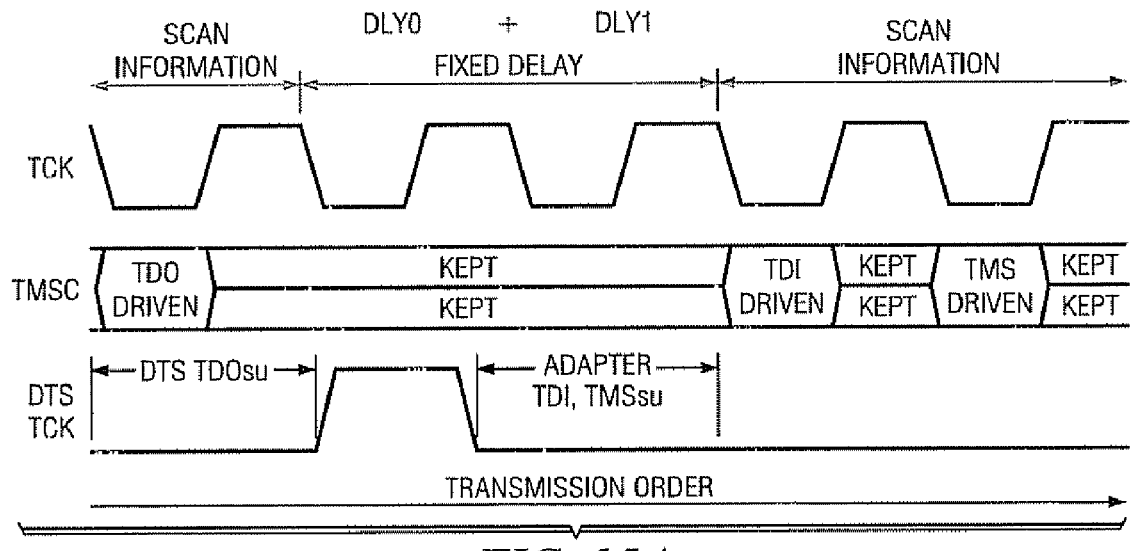
*FIG. 15A*
*FIG. 15B*
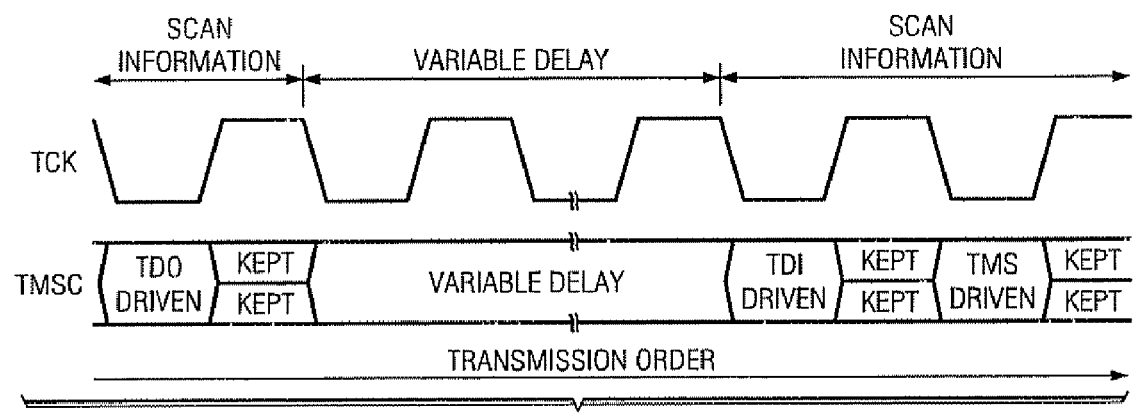
*FIG. 16A*

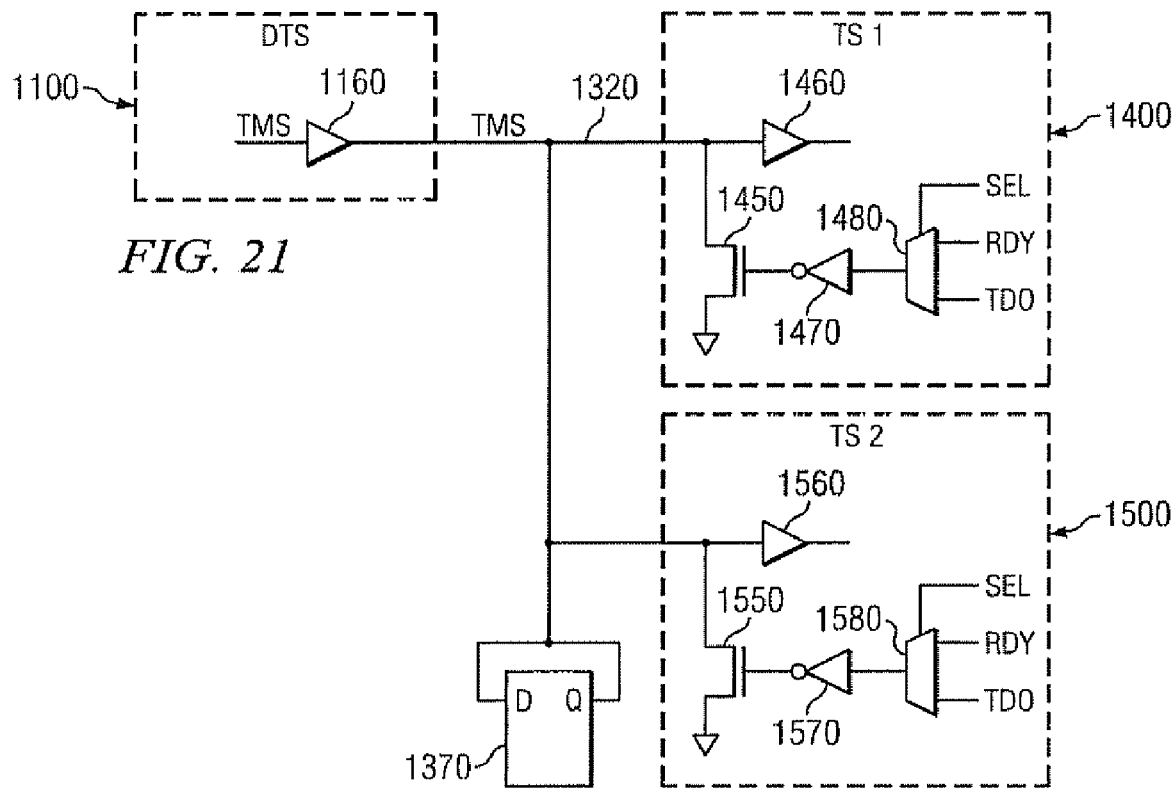
FIG. 21
| 31 | 28 27 | 16 15 | 01 00 |
|---|---|---|---|
| NODE ID | PART NUMBER | MANUFACTURER | 0 |
| wwww | yyyyyyyyyyyy | xxxxxxxxxxxxxxx | 0 |
FIG. 23
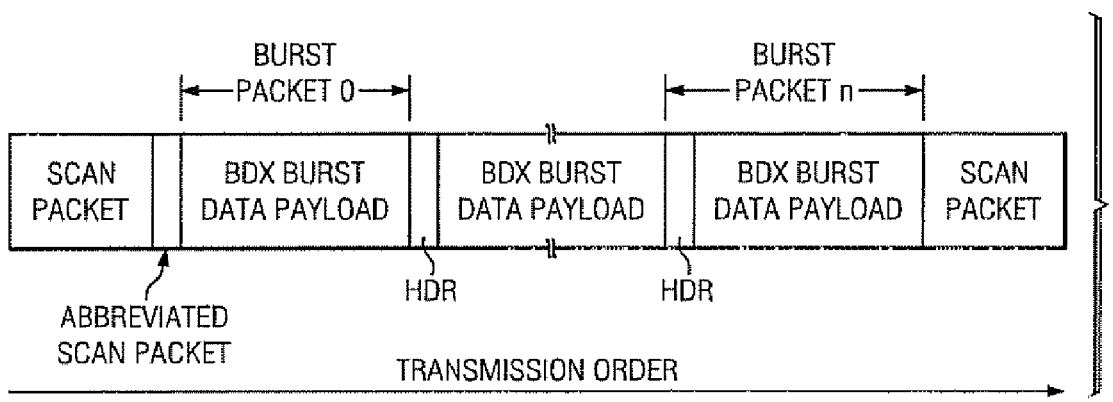
FIG. 24

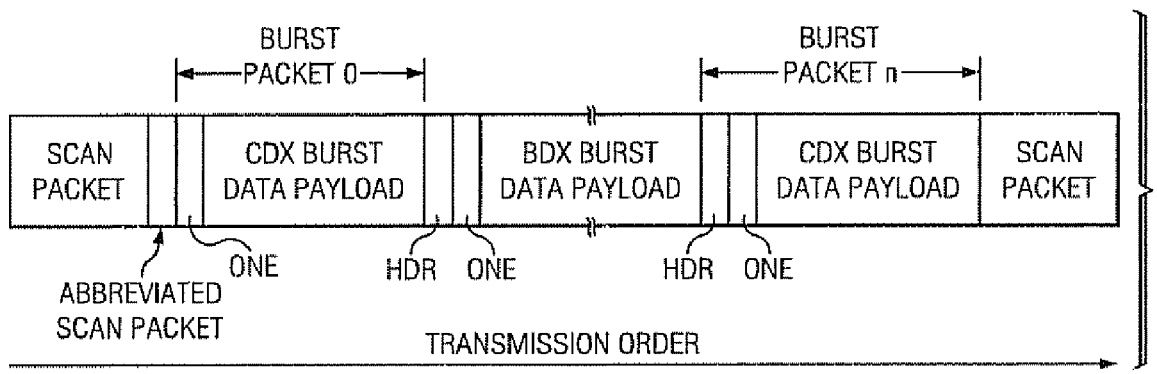
FIG. 28
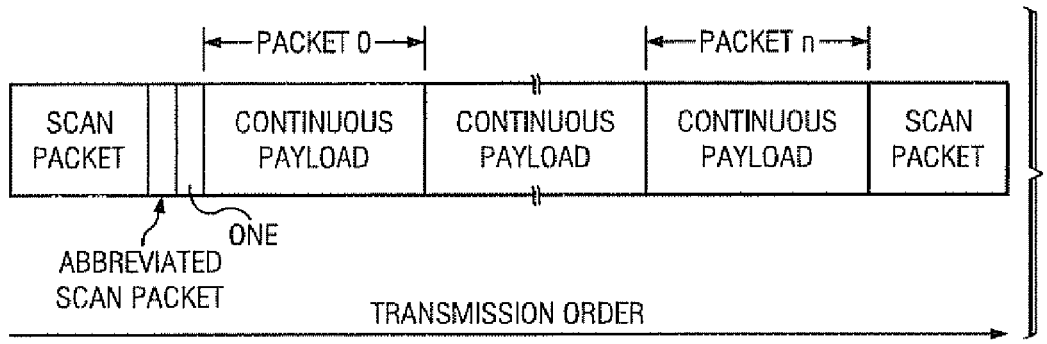
FIG. 29
FIG. 30

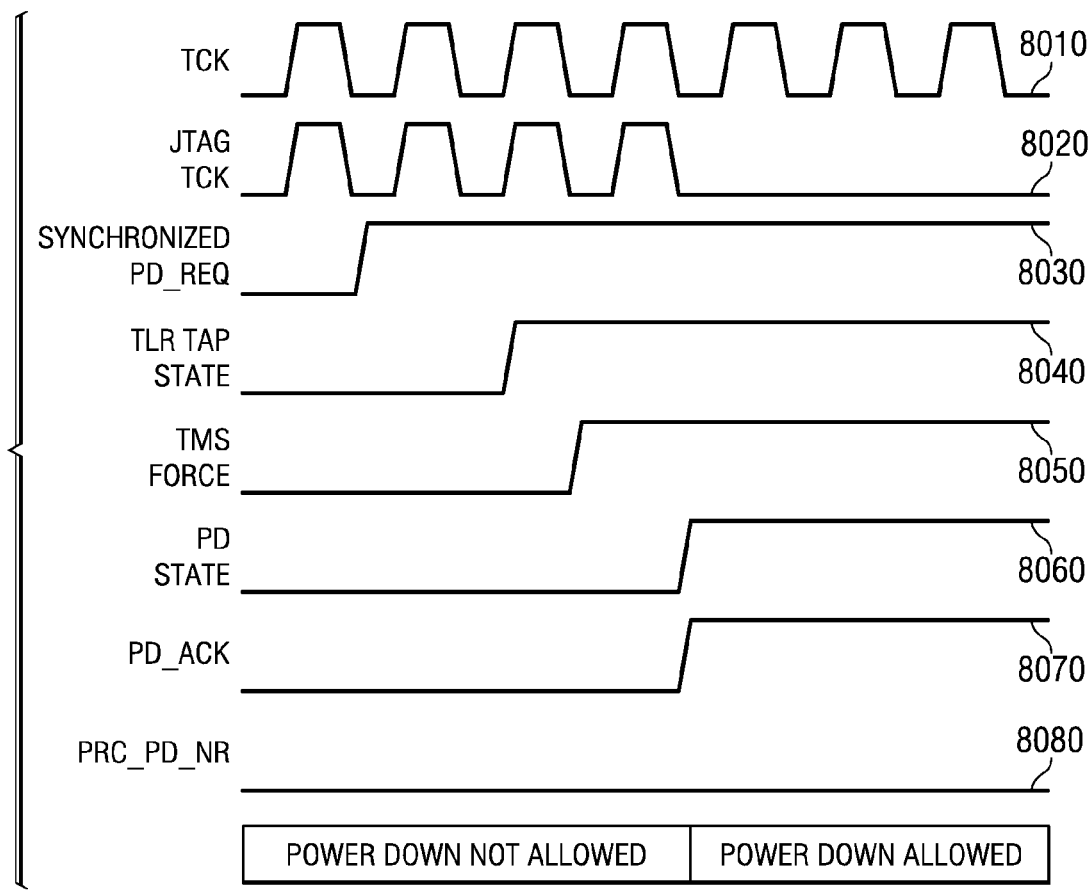
FIG. 31
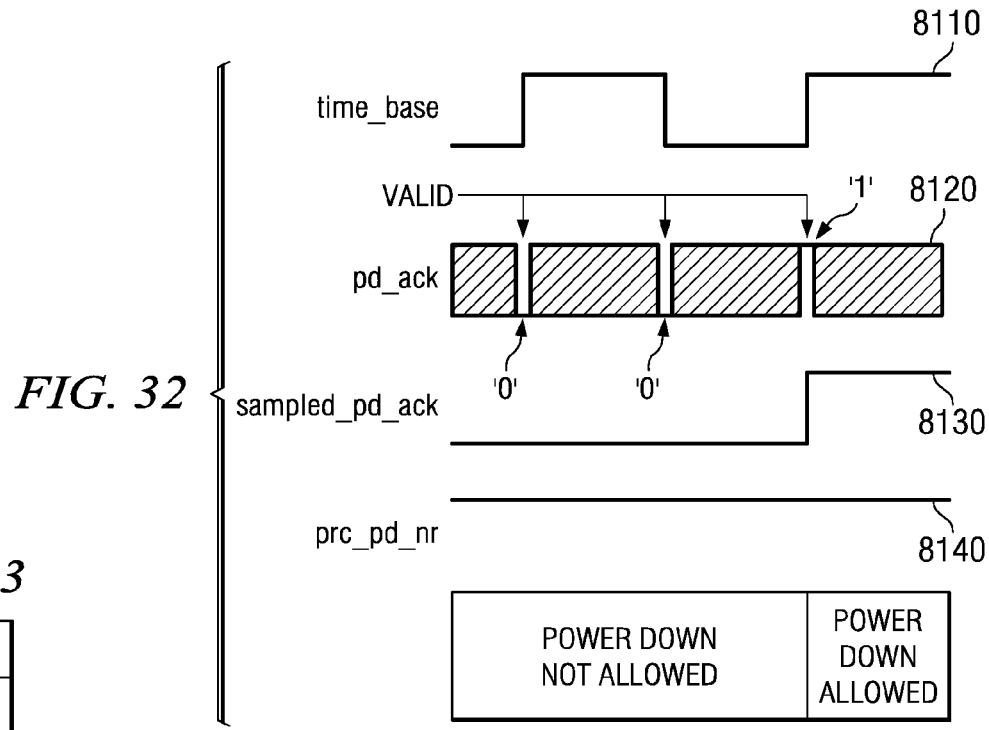
FIG. 32
FIG. 33
| FIG. 33A |
| --- |
| FIG. 33B |

RECEIVING CONTROL, DATA, AND CONTROL SEGMENTS OF COMMUNICATION SCAN PACKETS

CROSS-REFERENCE TO RELATED APPLICATIONS

The present application claims the benefit of provisional application Ser. No. 60/689,381, filed Jun. 10, 2005 which is herein incorporated by reference. The present application is also a continuation-in-part, and claims the benefit of, nonprovisional application Ser. No. 11/351,443, filed Feb. 9, 2006 now U.S. Pat. No. 7,552,360, granted Jun. 23, 2009, which is also herein incorporated by reference.

Nonprovisional application Ser. No. 11/351,443 claims priority from:

provisional application Ser. No. 60/663,827, filed Mar. 21, 2005, provisional application Ser. No. 60/676,603, filed Apr. 29, 2005, and provisional application Ser. No. 60/689,381, filed Jun. 10, 2005.

Nonprovisional application Ser. No. 11/351,443 is a continuation-in-part of:

Prior application Ser. No. 11/293,067, filed Dec. 2, 2005, currently pending, which claims priority from Provisional Application No. 60/632,640, filed Dec. 2, 2004;

Prior application Ser. No. 11/292,598, filed Dec. 2, 2005, currently pending, which claims priority from Provisional Application No. 60/632,640, filed Dec. 2, 2004;

Prior application Ser. No. 11/293,599, filed Dec. 2, 2005, currently pending, which claims priority from Provisional Application No. 60/632,640, filed Dec. 2, 2004;

Prior application Ser. No. 11/292,597, filed Dec. 2, 2005, now U.S. Pat. No. 7,751,366, granted Aug. 4, 2009, which claims priority from Provisional Application No. 60/632,640, filed Dec. 2, 2004; and Prior application Ser. No. 11/292,703, filed Dec. 2, 2005, currently pending, which claims priority from Provisional Application No. 60/632,640, filed Dec. 2, 2004.

BACKGROUND

As electronic circuits and devices have become more complex, testing of these devices has become increasingly difficult. Test standards have been developed to address at least some of these testing difficulties. One such standard, written by the Joint Test Action Group ("JTAG"), is IEEE standard number 1149.1, which describes the Standard Test Access Port and Boundary-Scan Architecture. Boundary scan is a methodology that allows controllability and observability of the boundary pins in a JTAG compatible device via software control. This capability allows testing of circuit boards that otherwise might not be practical or possible given the trace pitch and multi-layering of printed circuit boards today. Testing is accomplished through a series of registers, accessible through a serial bus, which allow the pins of JTAG compatible devices to be temporarily isolated from their respective devices. The pin on one isolated JTAG compatible device may be set to a known test state while the pin on another isolated JTAG compatible device is monitored to confirm that it is in the same known state. In this way individual traces on a printed circuit board may be tested. This type of testing has generally represented the limits of the testing capabilities of the JTAG architecture.

SUMMARY

The present disclosure describes a system and method for improved performance and optimization of data exchanges over a communications link.

BRIEF DESCRIPTION OF THE DRAWINGS

For a detailed description of the preferred embodiments of the invention, reference will now be made to the accompanying drawings in which:

FIG. 6C illustrates a simplified version of FIGS. 6A and 6B in accordance with at least some preferred embodiments;

FIG. 8A illustrates an example of an assignment of various functions to specific command levels in accordance with at least some preferred embodiments;

FIG. 8B illustrates an example of specific scan counts associated with specific advanced mode commands in accordance with at least some preferred embodiments;

FIGS. 10A and 10B illustrate a state transition diagram for a cJTAG adapter in accordance with at least some preferred embodiments;

FIG. 11 illustrates the format for an optimized scan message in accordance with at least some preferred embodiments;

FIG. 15A illustrates the timing diagram of a fixed delay between scan messages in accordance with at least some preferred embodiments;

FIG. 15B illustrates an example of delay control register bit settings in accordance with at least some preferred embodiments;

FIG. 16A illustrates the timing diagram for a variable delay between scan messages in accordance with at least some preferred embodiments;

FIG. 18 illustrates a cJTAG target system implementing a global bypass bit in accordance with at least some preferred embodiments;

FIG. 21 illustrates a circuit used to allow target system isolation for later link ID assignment in accordance with at least some preferred embodiments;

FIG. 23 illustrates an example of a format for a unique cJTAG isolation pattern in accordance with at least some preferred embodiments;

FIG. 24 illustrates an example of a burst background data transfer message format in accordance with at least some preferred embodiments;

FIG. 28 illustrates an example of a burst custom data transfer message format in accordance with at least some preferred embodiments;

FIG. 29 illustrates an example of a continuous custom data transfer message format in accordance with at least some preferred embodiments, FIG. 30 illustrates an example of power down modes;

FIG. 31 is a timing diagram illustrating an affirmative response power down;

FIG. 32 illustrates an example of non-response power down;

NOTATION AND NOMENCLATURE

Certain terms are used throughout the following discussion and claims to refer to particular system components. This document does not intend to distinguish between components that differ in name but not function. In the following discussion and in the claims, the terms "including" and "comprising" are used in an open-ended fashion, and thus should be interpreted to mean "including but not limited to . . . ." Also, the term "couple" or "couples" is intended to mean either an indirect or direct electrical connection. Thus, if a first device couples to a second device, that connection may be through a direct electrical connection, or through an indirect electrical connection via other devices and connections. Additionally, the term "system" refers to a collection of two or more parts and may be used to refer to a computer system or a portion of a computer system. Further, the term "software" includes any executable code capable of running on a processor, regardless of the media used to store the software. Thus, code stored in non-volatile memory, and sometimes referred to as "embedded firmware," is included within the definition of software.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims, unless otherwise specified. The discussion of any embodiment is meant only to be illustrative of that embodiment, and not intended to intimate that the scope of the disclosure, including the claims, is limited to that embodiment. "Compact JTAG (cJTAG)", revision 0.9, dated Nov. 20, 2005 is incorporated herein by reference. Similarly, "Compact JTAG (cJTAG)", revision 0.9, which provides a detailed specification for the compact JTAG ("cJTAG") architecture, is also meant to describe an illustrative embodiment and is not intended to limit the present disclosure to the cJTAG architecture described.

The IEEE 1149.1 standard (also known as the JTAG architecture) was originally developed for board-level interconnect testing (sometimes referred to as "boundary testing"). Standard JTAG implementations do not permit debug and testing of the individual JTAG compatible components that are mounted on a printed circuit board. Such component test and debug can be accomplished, however, through extensions and variations of the JTAG architecture, in accordance with at least some preferred embodiments, while still keeping the debug and test system ("DTS") that controls the test sequence, as well as the target system ("TS") comprising the components that are being tested, compatible with the underlying JTAG architecture and communication protocol.

Figure 1:
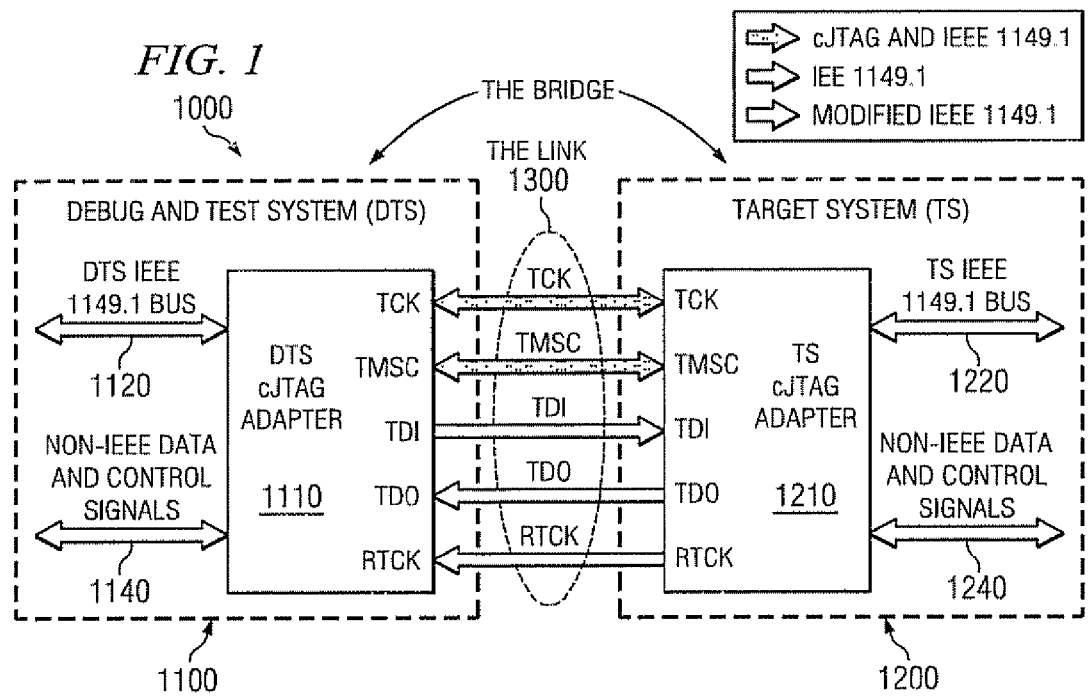
FIG. 1 illustrates the signals of a link between a debug test system and a target system of a cJTAG capable system in accordance with at least some preferred embodiments.

FIG. 1 illustrates a system 1000 constructed in accordance with at least some preferred embodiments, comprising a debug test system ("DTS") 1100 and a target system ("TS") 1200, coupled to each other by link 1300. The debug test system 1100 may comprise a DTS cJTAG adapter 1110, a DTS IEEE 1149.1 bus ("DTS bus") 1120, and non-IEEE data and control signals 1140. The term "cJTAG" refers to "compact JTAG," which is an extension of the JTAG standard that uses fewer communications signals, as will be described below The DTS cJTAG adapter 1110 provides the logic necessary to convert the standard JTAG signals present on DTS bus 1120 into the signals and message formats defined for cJTAG operation. The DTS bus 1120 couples to a DTS test access port ("TAP") controller (not shown), which provides the standard JTAG functionality of the debug test system 1100. The non-IEEE data and control signals 1140 couple to other logic within the debug test system that provides extended functionality beyond that provided by the DTS TAP controller.

Similarly, the target system ("TS") 1200 may comprise a TS cJTAG adapter 1210, a TS IEEE 1149.1 bus ("TS bus") 1220, and non-IEEE data and control signals 1240. The TS cJTAG adapter provides the logic necessary to convert the standard JTAG signals present on TS bus 1220 into the signals and message formats defined for cJTAG operation. The TS bus 1220 couples to a TS test access port ("TAP", not shown), which provides the standard JTAG functionality of the target system 1200. The non-IEEE data and control signals 1240 couple to other logic within the target system that provides extended functionality beyond that provided by the TS TAP.

Debug test system 1100 is capable of sending test and debug sequences via link 1300 to target system 1200. These sequences allow debug test system 1100 to configure target system 1200 for a test, execute the test, and read back the results of the test. The debug test system 1100 may be configured to couple to the target system 1120 using a four or five wire implementation of link 1300 as defined under the JTAG architecture. The link 1300 includes signals TCK (clock), TMSC (mode select), TDI (data in), TDO (data out), and optionally RTCK (return clock). As shown, at least the TCK, TMSC, TDI and TDO signals can be used when the debug test system 1100 communicates with the target system 1210 according to the JTAG protocol. In this mode of operation, the signals from the DTS IEEE 1149.1 bus 1120 and the TS IEEE 1149.1 bus ("TS bus") 1220 are passed by DTS cJTAG adapter 1110 and TS cJTAG adapter 1210 without modification across link 1300.

The system 1000 also incorporates a variation of the JTAG architecture that provides an alternative physical interface that is designed to reduce the pin count of the interface between the debug test system 1100 and the target system 1200. This alternative configuration of the link 1300 allows the debug test system 1110 to communicate with the target system 1210 using only the TCK and TMSC signals of link 1300. In this mode of operation the TDI and TDO data are serialized together with the TMSC data and sent across the TMSC signal of link 1300 as a multi-bit serial message packet. Each packet may be either a control packet that is used to configure a component within the system 1000, or a data packet used to transfer data from one component to another. Although the TMSC signal is used for transferring the serial packet data in the preferred embodiment of FIG. 1, other signals (e.g., TDI and TDO) may be used and the present disclosure is intended to encompass all such embodiments.

Figure 2A:
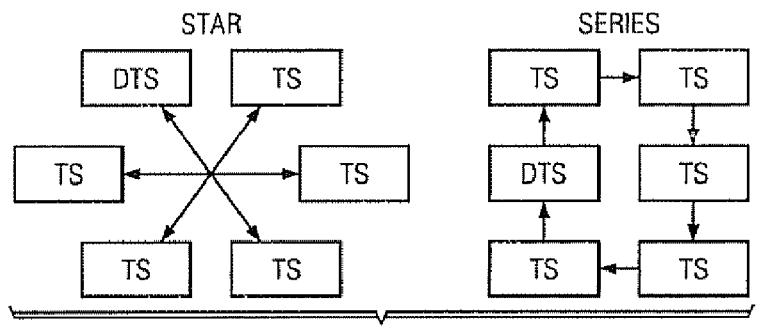
FIG. 2A illustrates star and series configurations that are possible within a cJTAG capable system in accordance with at least some preferred embodiments.
Figure 2B:
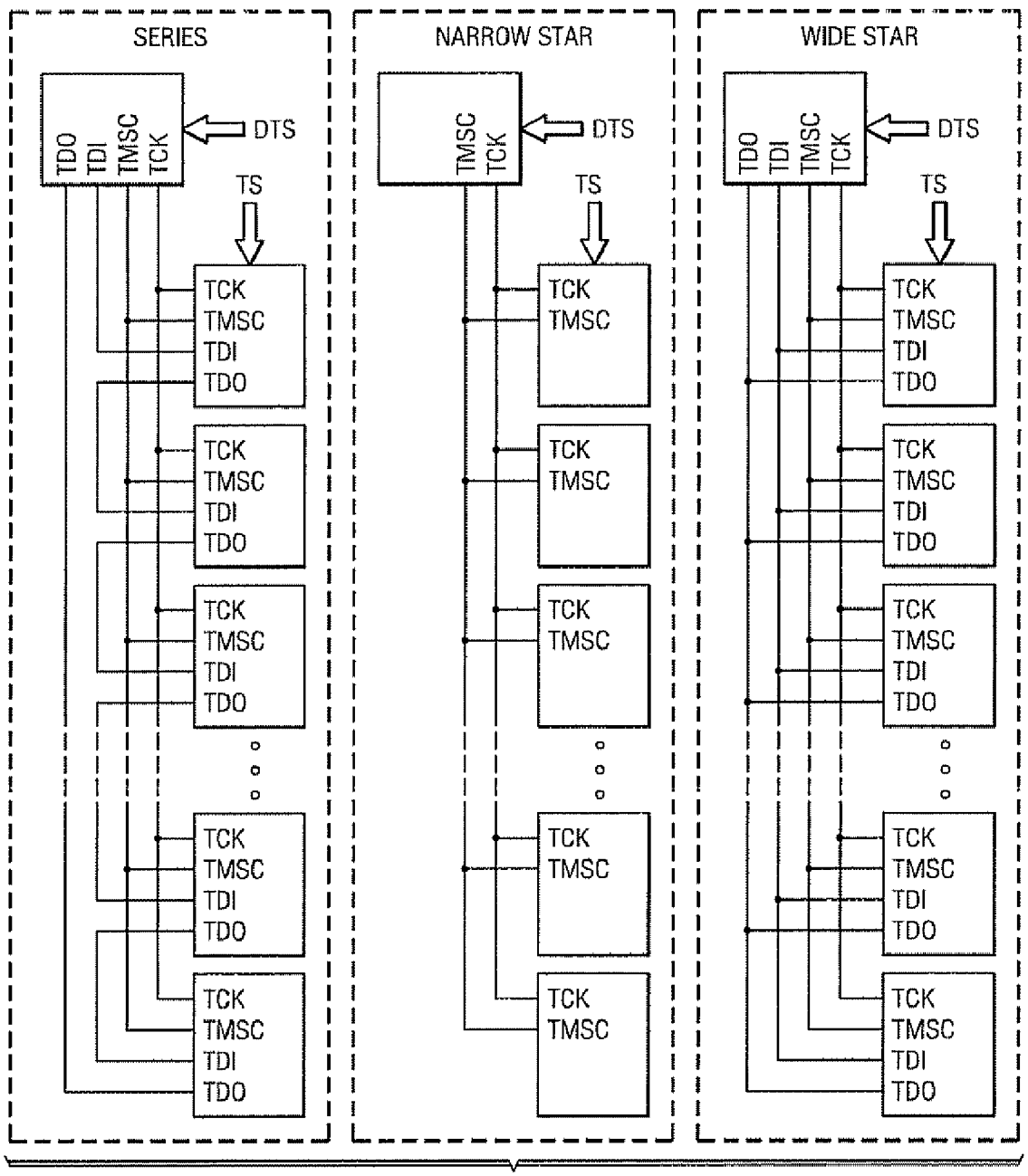
FIG. 2B illustrates series, narrow star and wide star configurations that are possible within a cJTAG capable system in accordance with at least some preferred embodiments.
Figure 2C:
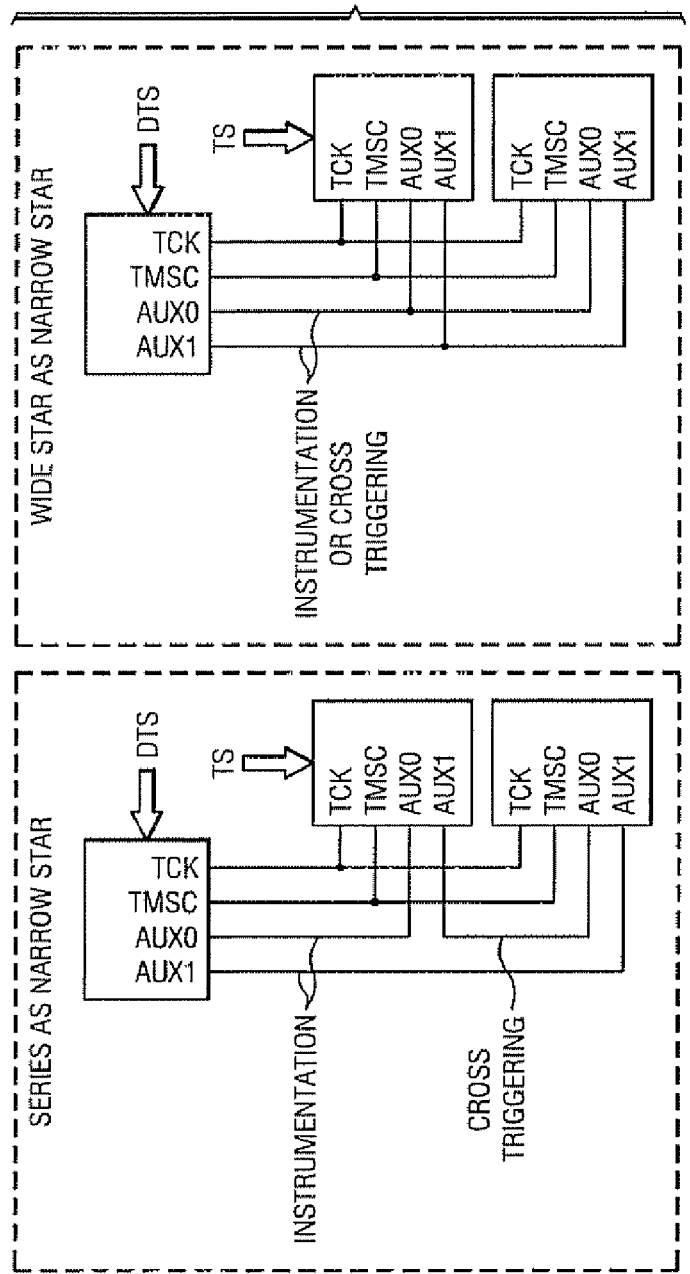
FIG. 2C illustrates a series and a wide star cJTAG capable system configured, both configured to operate as narrow star configurations in accordance with at least some preferred embodiments.

FIG. 2A illustrates the two basic interconnect configurations for both JTAG and cJTAG systems. In the Star configuration, each target system may be accessed directly by the debug test system, while in the Series configuration the debug test system can only send data to, or receive data from, a target system through any and all intervening target systems. FIG. 2B illustrates how each of the two physical interfaces described above may used to couple a debug test system to one or more target systems. The Series configuration is allowed under both the JTAG architecture and permits mixing JTAG and cJTAG target systems The Narrow Star and Wide Star configurations are only valid within the cJTAG architecture. The Narrow Star configuration includes the use, in at least one preferred embodiment, of only the TCK and TMSC signals. Both signals are shared by all of the target systems. cJTAG target systems that have a wide physical interface, and which are coupled to each other in either a Series or Wide Star configuration, may optionally operate as if configured to operate in a Narrow Star mode, as shown in FIG. 2C.

It should be noted that throughout this disclosure a distinction is made between the TMS bit that is defined in the IEEE standard and the TMSC signal of the link 1300 When operating the system according to the standard JTAG protocol, the TMS bit is the only bit transmitted using the TMSC signal But when the system is operating according to the cJTAG protocol, the TMS bit is just one of several bits that may be transferred across the link 1300 using the TMSC signal. Thus, to differentiate between the two, the bit is referred to as the TMS bit, while the signal of the link is referred to as the TMSC signal.

Referring again to FIG. 1, both DTS cJTAG adapter 1110 and TS cJTAG adapter 1210 appear to continue to operate according to the standard four or five wire JTAG protocol when viewed from either the DTS bus 1120 or the TS bus 1220. The cJTAG adapters 1110 and 1210, together with link 1300, thus provide an abstraction layer or bridge that hides the underlying 2-wire cJTAG physical interface. This bridge can operate according to the JTAG protocol ("IEEE mode"), or can alternatively operate according to the cJTAG protocol ("advanced mode") in a manner that is transparent to DTS bus 1120, TS bus 1220 and other portions of the debug test system and target systems that operate exclusively in IEEE mode. When operating in advanced mode, data and control information may be exchanged with the DTS cJTAG adapter 1110 via either DTS bus 1120 or non-IEEE data and control signals 1140. Likewise, data and control information may be exchanged with TS cJTAG adapter 1210 via either TS bus 1220 or non-IEEE data and control signals 1240 when operating in advanced mode.

Figure 1A:
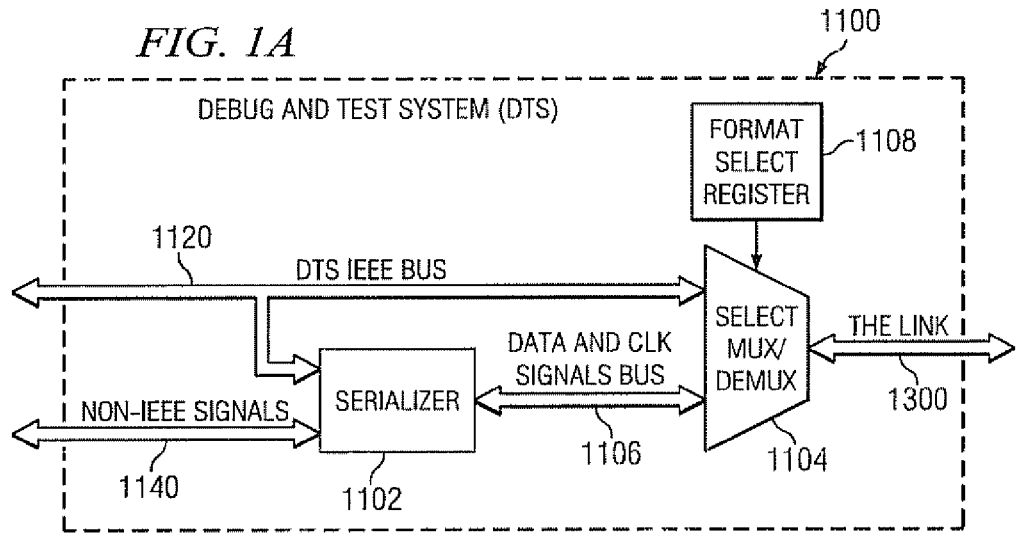
FIG. 1A illustrates a detailed block diagram of the debug and test system of FIG. 1 in accordance with at least some preferred embodiments.

The ability to select between multiple modes of operation is illustrated by the preferred embodiment of FIG. 1A, which shows a more detailed view of debug and test system 1100. DTS IEEE bus 1120 couples to both select multiplexer/demultiplexer (Select Mux/Demux) 1104 and serializer 1102. When the debug and test system 1100 is configured to operate in IEEE mode, select multiplexer/demultiplexer 1104 selects IEEE bus 1120, and the signals from IEEE bus 1120 drive the corresponding signals on the link 1300. The selection is controlled by the state of format select register 1108, which couples to the selection control input of multiplexer/demutltiplexer 1104. If the debug and test system 1100 is configured to operate in a mode other than IEEE mode (e.g., advanced mode), then the output of serializer 1102, which couples to select multiplexer/demultiplexer 1104 via data and clock signal bus 1106, is selected via a corresponding state of format select register 1108, and the TMS and TCK signals from IEEE bus 1120 drive the TMSC and TCK signals, respectively, of the link 1300.

The TDI and TDO signals of the link 1300 may also be driven by signals originating from a source other than the IEEE bus 1120 or serializer 1102. Serializer 1102 may serially encode the signals from IEEE bus 1120 (e.g., TDI, TDO and TMS), as well other IEEE bus signals and non-IEEE signals, depending upon the configuration of serializer 1102. Further, these same signals may also be routed unserialized through the serialized 1102 and the select multiplexer/demultiplexer 1104 to either the TDI or TDO signals (or both) of the link 1300. Other modes beyond IEEE and advanced mode, as well as other combinations of serialized and non-serialized signals, may become apparent to those skilled in the art, and all such modes and combinations of signals are intended to be within the scope of the present disclosure.

Throughout the present disclosure, the preferred embodiments described include one or more protocols (e.g., cJTAG) in addition to the JTAG protocol, wherein the JTAG protocol is the default protocol at power-on/reset (POR). However, other embodiments are possible in which a protocol other than the JTAG protocol operates by default after a power-on/reset, and in yet other embodiments the protocol that operates by default after a power-on/reset may be programmable. All such embodiments are intended to be within the scope of the present disclosure. Further, although one protocol is designated the default protocol, each protocol operates independent of the other protocol. When one protocol is operating, all of the other protocols are in an inactive state. Each of the other protocols are maintained in an inactive state by designing each protocol such that operations by one protocol are seen as no-operations (No-Ops) or "inert" operations by the other protocols. In the preferred embodiments described in the present application, this is accomplished by designing all of the protocols around the JTAG TAP state machine (shown in FIG. 4), and selecting states, groups of states, state transitions, and/or state sequences that define operations within one protocol, but that are seen as inert operations by the other protocols.

As already noted, each protocol of the preferred embodiments described operates independent of the other, functioning in a peer-level configuration rather than a parent-child configuration. Each protocol transmits and receives messages through the physical interface coupling the debug and test systems 1100 of FIG. 1 to one or more target systems, such as target system 1200. Messages are exchanged under one protocol without intervention by the other protocols (e.g., without encapsulation of one protocol by another). The physical interface is thus time-shared by the protocols, with each protocol being separately selected for operation by the debug and test system 1100 as needed. Protocol selection is performed without giving any single protocol or group of protocols preferential access to the physical interface (i.e., link 1300).

Transitions between protocols may be triggered either by a power-on/reset, or by a software controlled selection sequence that is recognized by all protocols. Further, transitions by the system 1000 from one protocol to another are done without requiring that the system 1000 first return or transition through a reference or top-level protocol (a prioritized configuration), without requiring that the system 1000 return to a protocol previously selected after completing operations under a currently selected protocol (a nested configuration), and without an intervening hardware or software generated reset. It should be noted that although prioritized protocol configurations, nested protocol configurations, and resets are not required for operation of the preferred embodiments disclosed, embodiments that incorporate such protocol configurations and resets are not precluded, and are thus also within the scope of the present disclosure.

As will be described below, a number of different message formats are possible within each protocol. These message formats are defined by the bits that are included within the message, and the TAP state machine states (FIG. 4) used to transmit and/or receive a message so formatted. It is noted that the present disclosure, while describing certain specific formats, is not intended to be limited to such formats Also, selection of a format in at least some of the preferred embodiments may be performed dynamically without the need to reset the test and debug system 1100, the target system 1200, or the link 1300. Message formats may also be selected based on the characteristics of a specific target system, and may be changed dynamically as different target systems are each selected.

Figure 3:
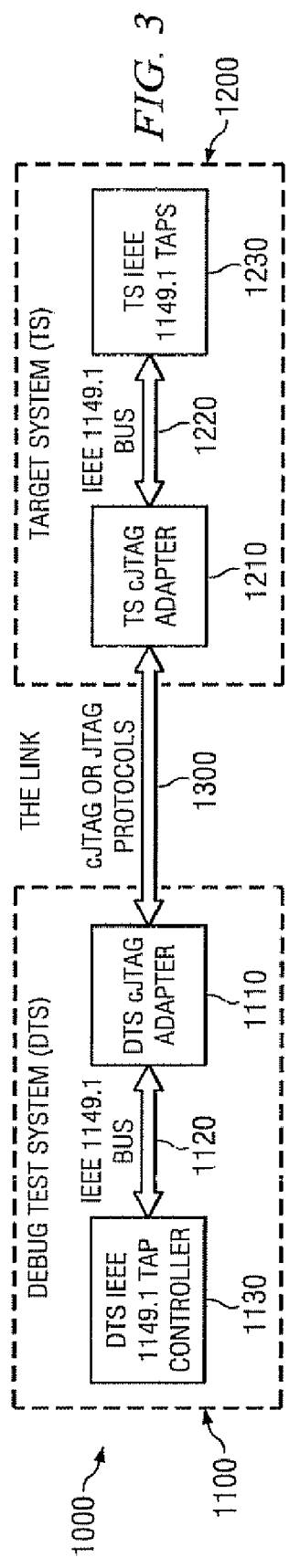
FIG. 3 illustrates a block diagram overview of a cJTAG capable system in accordance with at least some preferred embodiments.

FIG. 3 provides an alternative illustration of the system 1000 that includes DTS IEEE 1149.1 TAP controller ("DTS TAP controller") 1130 and TS IEEE 1149.1 TAP ("TS TAP") 1230. DTS TAP controller 1130 couples to DTS cJTAG adapter 1110 via DTS bus 1120, and TS TAP 1230 couples to TS cJTAG adapter 1210 via TS bus 1220. The system 1000 of FIG. 3 can select between IEEE mode and advanced mode in one of at least two ways. First, the operational mode of the system 1000 can be selected when the system is first powered up. Upon initial power-up, the system 1000 asserts a power-on-reset signal that sets all components within the system to a known default state. The cJTAG adapters 1110 and 1210 both initially default to IEEE mode. In the preferred embodiment of FIG. 1, the TMS bit is held at a zero state while the TDO bit is sequenced through a pattern that causes the cJTAG adapters, which monitor the TDO bit, to transition into advanced mode. In at least some of the preferred embodiments, this is the same pattern that would cause a transition into advanced mode if presented on the TMS bit during normal operation of the system 1000.

Figure 4:
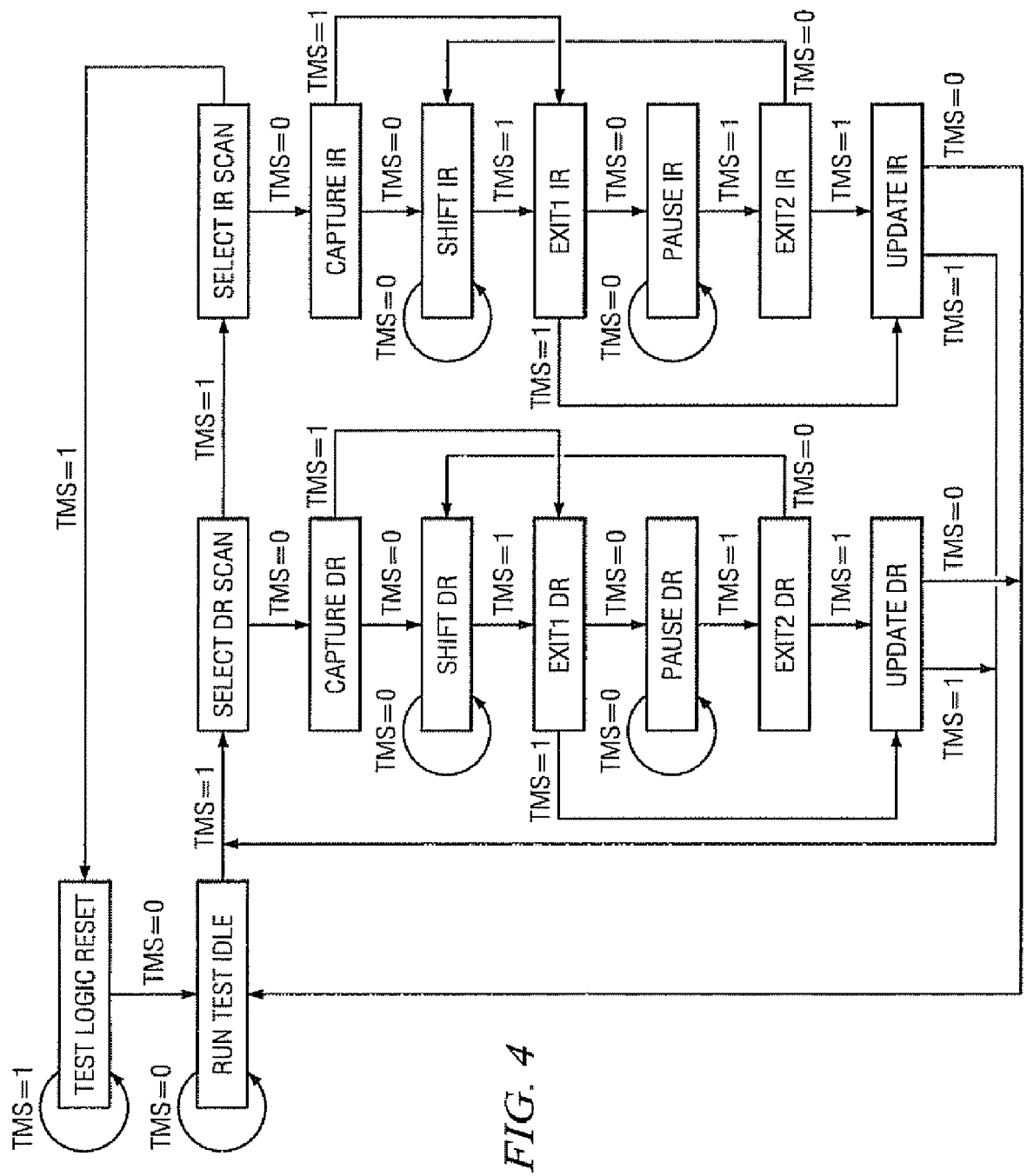
FIG. 4 illustrates the state transition diagram for a TAP state machine within a cJTAG capable system in accordance with at least some preferred embodiments.

FIG. 4 shows the state transition diagram implemented by the state machine of TS TAP 1230 in accordance with IEEE standard number 1149.1. Sixteen states are shown and transitions from one state to another are effectuated by transitions of the TMS bit. When the TAP 1230 first reaches the Test-Logic-Reset state, the instruction register is loaded with either an IDCODE or BYPASS opcode. As can be seen in FIG. 4, holding the TMS bit to a binary zero causes the TS TAP 1230 to transition from the Test-Logic-Reset state to the Run-Test/Idle state, where it stays as long as the TMS bit is held to a logical zero. To transition the system 1000 to the advanced mode of operation upon a power-on reset, the TDO bit is sequenced through a predetermined sequence of bit patterns while the TMS bit continues to be held at a zero state. When the TS cJTAG adapter 1210 detects this sequence, the TS cJTAG adapter 1210 begins operating in the advanced mode. This pattern for the TDO bit will cause the state machine of the TS TAP 1230 to transition through the states of the state machine without passing through either the shift_DR or shift_IR states. By avoiding these states, data is not moved in or out of any of the standard JTAG data or instruction registers, which freezes the JTAG configuration of the target system 1200. Thus, activating advance mode operation of the TS cJTAG adapter 1210 has no effect on the TS TAP 1230.

Figure 5:
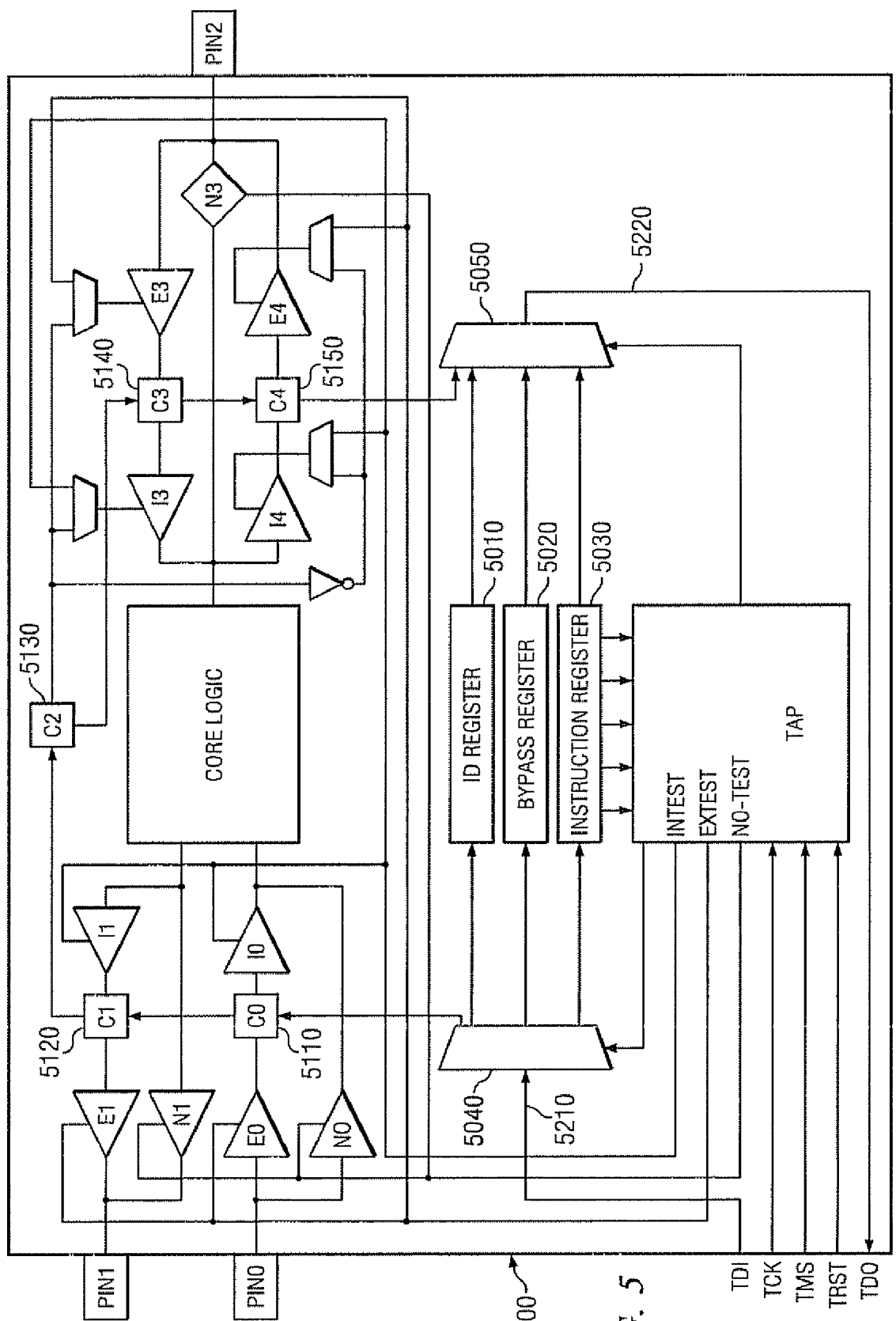
FIG. 5 illustrates a high-level schematic of a JTAG target system in accordance with at least some preferred embodiments.

The second way in which the system 1000 of FIG. 3 can select between IEEE mode and advanced mode is through the use of "inert" JTAG data scan sequences after the system is past power-on reset and is operational. Inert data scans are JTAG data scan sequences that do not do anything useful and thus are not normally used. Normally a JTAG data scan sequence includes a fixed series of operations designed to accomplish a useful function, such as reading or loading a JTAG data register within the target system 1200. FIG. 5 illustrates at least some of the data registers within the target system 1200 that are accessible by the TS TAP 1230, in accordance with at least some preferred embodiments. These include the ID register 5010, the bypass register 5020, and a collection of input cell, output cell and enable cell registers 5110 through 5150. To load a register, for example, the register type (data or instruction) is first selected, and the current contents of the destination register (e.g. the bypass register) are then moved to the output shift register of register output multiplexer 5050 though a capture operation. Next, a series of shift operations are performed wherein new data is shifted into the input shift register of register input demultiplexer 5040 from the TDI input 5210 and old data is simultaneously shifted out the TDO output 5220. Finally, an update operation is performed to transfer the new data from the input shift register of register input demultiplexer 5040 to the actual register to which the data is destined.

Figure 6A:
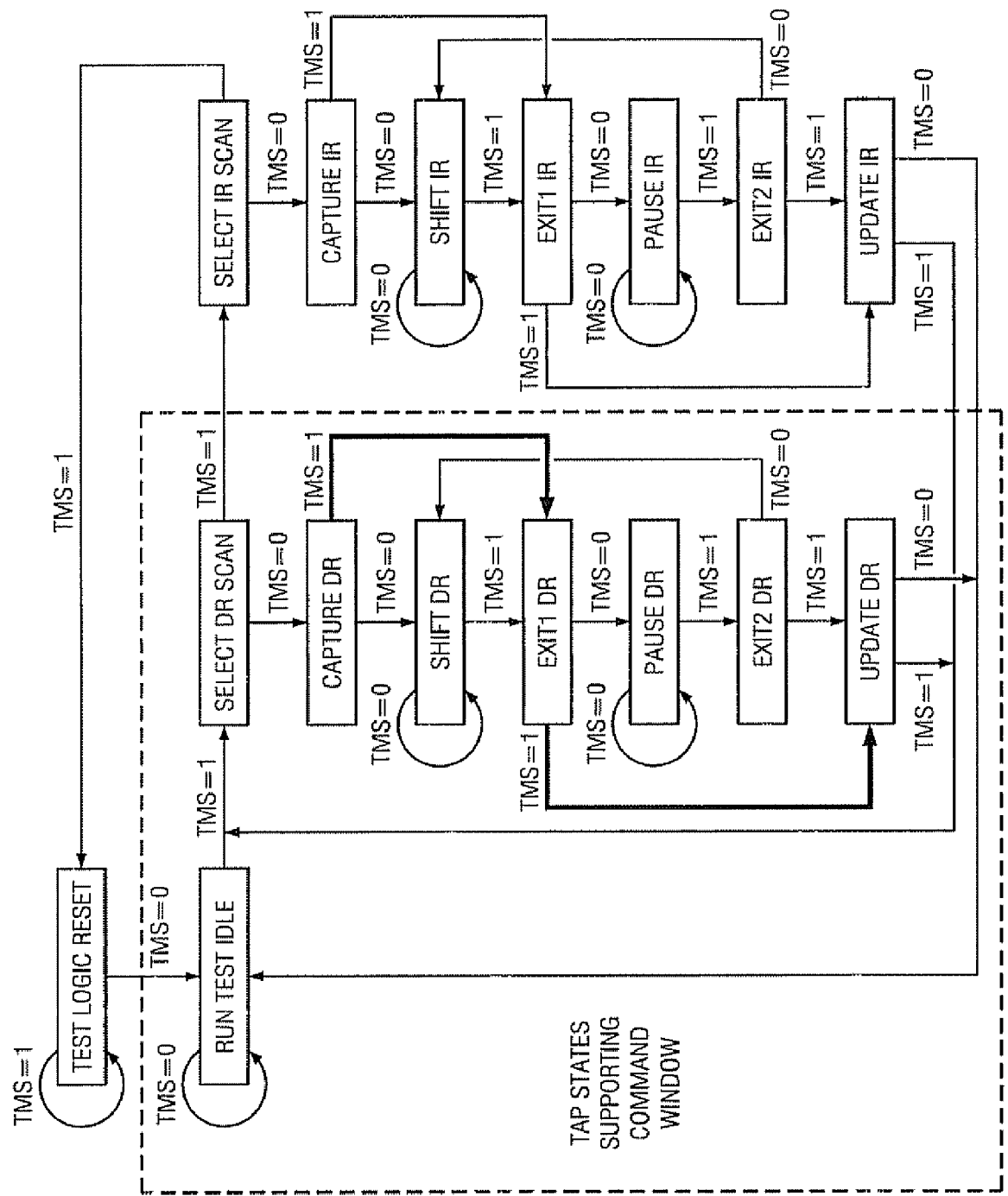
FIG. 6A illustrates a first example of an inert JTAG data scan sequence usable to enter into an advanced mode of operation in accordance with at least some preferred embodiments.
Figure 6B:
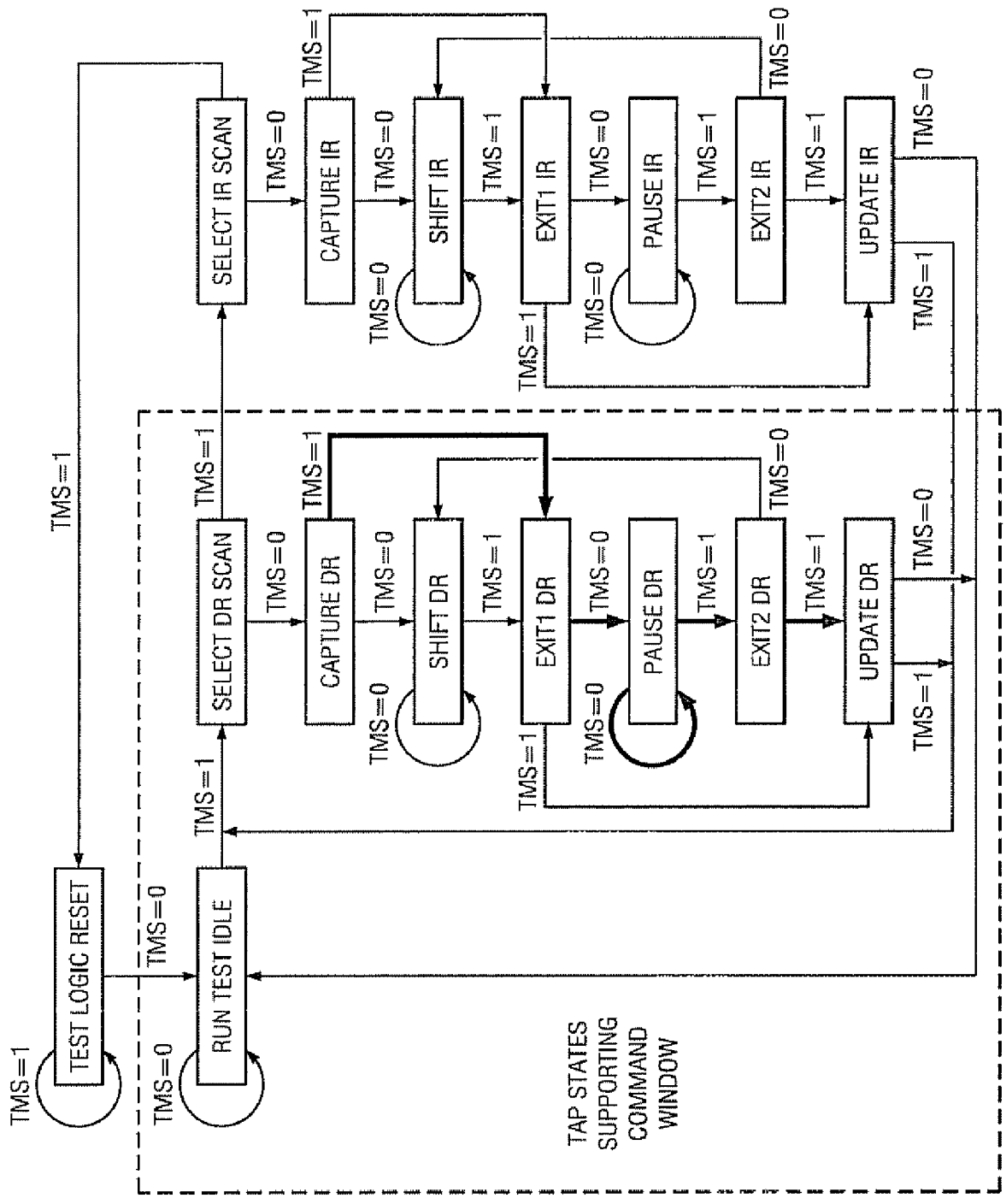
FIG. 6B illustrates a second example of an inert JTAG data scan sequence usable to enter into an advanced mode of operation in accordance with at least some preferred embodiments.

FIGS. 6A and 6B illustrate how inert JTAG data scan sequences may be used to transition through the TAP state transition diagram without actually loading a value. As can be seen, all of the operations that would normally take place in, for example, a JTAG data scan sequence to load a register take place, except for the sequence of shift operations. In FIG. 6A, the sequence of states (shown shaded) includes the Capture_DR state, the Exit1_DR state, and the Update_DR state. Similarly, in FIG. 6B the sequence of states include the Capture_DR state, the Exit1_DR state, the Pause_DR state, the Exit2_DR state, and the Update_DR state.

In each of the sequences of FIGS. 6A and 6B, the capture operation causes the current value of the destination register to be transferred to the output shift register of register output multiplexer 5050, and the update operation causes the value in the input shift register of register input demultiplexer 5040 to be loaded into the destination register. But without intervening shifts, all of the registers can end up containing the same value in at least some situations, which is the value that was already in the input shift register of register input demultiplexer 5040 and the destination register. As a result, no data is transferred in or out of the target system 1200, and the contents of the destination register remain unaltered in at least some cases. Because no data bits are shifted in or out of the target system 1200, the inert JTAG data scan sequences are referred to as "zero-bit" scans ("ZBS"). When a zero-bit scan is preceded by some action that loads a BYPASS instruction or a read-only instruction (e.g., the IDCODE instruction), the operation performed has no consequences since the register bit changed is either the bypass bit or a bit that is not writeable (e.g., the read-only identification bits). FIG. 6C summarizes the relevant TAP states that together each define an example of a zero-bit scan. Although two examples are shown, many others are possible and all such sequences of states that define a zero-bit scan are intended to be within the scope of this disclosure. Because zero-bit scans do not corrupt the contents of JTAG registers other than that specified by the inert instruction (e.g., bypass), these scans, either independently or in conjunction with other scan activity following the zero-bit scan, can be used to change the behavior of the DTS and TS cJTAG adapters without other consequences.

Figure 7:
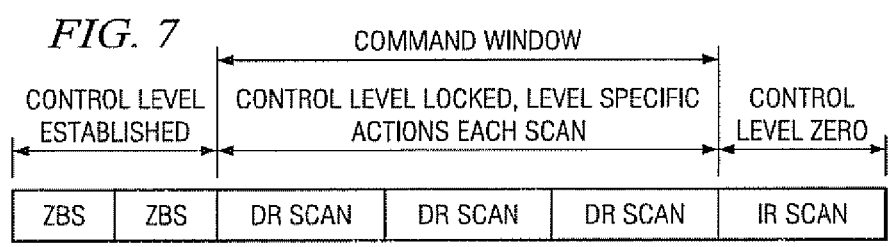
FIG. 7 illustrates the format of an advanced mode command window in accordance with at least some preferred embodiments.

Because a zero-bit scan is essentially a no operation (no-op) to the DTS TAP controller 1130 and the TS TAP 1230, any number of zero-bit scans may be executed one after the other. The ability to send any number of consecutive zero-bit scans allows multiple tiers of capabilities or "control levels" to be defined. Each control level corresponds to the number of consecutive zero-bit scans, and each control level enables a different set of capabilities. A control level is thus synonymous with a command window, wherein opening a command window represents entry into a new control level. FIG. 7 illustrates an example of a command window in which two, zero-bit scan sequences open the command window. The two zero-bit scans that are used to open the window are also used to designate the control level as control level 2. FIG. 8A shows an example, in accordance with at least some preferred embodiments, of different capabilities being allocated to each control level. The example shows that control levels 1-5 are allocated to the cJTAG protocol (with control levels 4 and 5 being reserved). Control level 0 represents IEEE mode (JTAG protocol), and control levels 6 and above are user defined levels available for extended capabilities beyond those defined for the cJTAG protocol of the preferred embodiments described herein. Other extended capabilities and control levels, defined through the use of zero-bit scans as a control event, will become apparent to those skilled in the art, and the present disclosure is intended to encompass all such capabilities and control levels.

Referring again to FIG. 4, in at least some preferred embodiments a control level is established when a Shift_DR TAP state is entered by the TAP state machine following one or more zero-bit scans, but without an intervening Select_IR or test logic reset (TLR) state. Such scans (referred to as DR-Scans) may each be associated with a specific control level thus established. The zero-bit scans define control levels above level 0 and do not require the use of the TDI and TDO signals, since data is not transferred using these signals during a zero-bit scan. Such operation thus allows the use of configurations such as the two-wire narrow star configuration previously described. Other mechanisms not requiring the TDI and TDO signals, and other TAP states (e.g., the Pause_DR state) may be used to implement at least some of the preferred embodiments, and all such mechanisms and states are intended to be within the scope of the present disclosure.

In control levels above level 0 (i.e., within a command window), the number of TAP states (i.e., the number of clock cycles that advance the TAP state machine) spent in the Shift_DR state are counted (though as already noted, states other than the Shift_DR state could also be used for this purpose). The count is saved as data in a temporary register if the count is greater than 16. A count of less than 16 is interpreted as a command and is combined with the previously saved count to specify the particular command desired. One such command, for example, may be to change to a protocol other than the protocol being used to communicate over the TMSC signal. FIG. 8B illustrates an example of counts used to define advanced mode commands in this manner. Although the example shown in FIG. 8B uses a 5-bit data width, any number of bits may be encoded in this manner and the present disclosure is intended to encompass all bit widths. Further, data may be specified using techniques other than counts (e.g., by the order of the transitions through states within the TAP state machine), or in combination with counts, and all such techniques and combinations of techniques are also intended to be within the scope of the present disclosure.

In at least some preferred embodiments, control levels above 0 may be used to set a state that remains defined outside of the command window through the use of an extended command register (not shown) within both the debug and test system and the target system of FIG. 1. Bits within this register can be set or cleared using the zero-bit scan count as described above, or using a combination of zero-bit scans and other TAP state activity following the zero-bit scans. In this manner, the register bit settings are retained after the command window has closed, allowing the system to operate according to a protocol defined for a particular control level outside of the command window, or to define any other function controllable by the bits that survive the closing of a command window. The effects of such bits may begin when the bits initially change state within the command window, or after the command window is closed. Similar zero-bit scan sequences may subsequently be used to clear the register bits to exit the selected control level. Other variations to the use of zero-bit scan sequences, counts, and TAP state sequence as a means to define values that survive the closing of a command window may become apparent to those skilled in the art, and all such variations are intended to be within the scope of the present disclosure.

In at least some preferred embodiments, a command window is closed when an instruction register select operation is performed, or when the test logic reset TAP state is entered. Other TAP state sequences may be defined that cause a command window to close, and all such sequences are intended to be within the scope of the present application. Once a command window is closed, the actions enabled by the open command window cease to be available The command windows of the preferred embodiments provide the capability of altering the behavior of the link 1300 of FIG. 3. Switching to advanced mode is an example of such a use of a command window. Once in the advanced mode of operation, the debug test controller 1100 of FIG. 3 no longer bypasses the DTS cJTAG adapter 1110, instead communicating through the DTS cJTAG adapter 1110 with the DTS TAP controller 1130. Similarly, cJTAG sequences received by the target system 1200 are passed through the TS cJTAG adapter 1210, which would be bypassed if the target system 1200 were operating in IEEE mode. Operation of the DTS and TS cJTAG adapters 1110 and 1210 in advanced mode continues until an event that terminates the current sequence of operations and transitions the DTS and TS cJTAG adapters 1110 and 1210 back to IEEE mode. In the preferred embodiment of FIG. 3, termination of advanced mode is accomplished by a zero-bit scan sequence that opens a command window, within which bits are set that indicate that IEEE mode operation is desired.

Command windows are thus managed using clear entry and exit sequences. A cJTAG command window is defined that starts with, for example, one or more zero-bit scans, followed by cJTAG sequences (data register scans are used in the preferred embodiment of FIG. 3), and ending, for example, with an instruction register scan. The structure of such a scan cJTAG sequence and the resulting command window are illustrated in FIG. 7. Such sequences may be used within the preferred embodiments described in the present disclosure to manage a variety of functions, including those that enable and disable advanced mode.

It should be noted that although command windows are used to transition between modes of operation, these modes do not depend upon whether a command window is open or closed, and whether the command window remains open or closed does not depend upon the mode of operation of the system. Command windows may be opened or closed at any time through appropriately executed state sequences, and are thus dependent upon the state of the TAP state machine, not the mode of operation of the system. Likewise, the mode of operation depends upon the setting of the format select register (FIG. 1A), and does not depend upon the state of the TAP state machine.

Command windows as described above may be used to access and modify a variety of control registers within both the debug and test system and the target system. Some of the registers may perform functions common to both systems, and indeed may be set to common values. In at least some of the preferred embodiments, a single write to a common or "shared" control register within the debug and test system will automatically result in the same value being written to the corresponding register of a target system adapter. in some preferred embodiments, a single write to the register within the target system will result in a write of the same value to the corresponding register in only those target systems that are selected to respond to the write.

Figure 9:
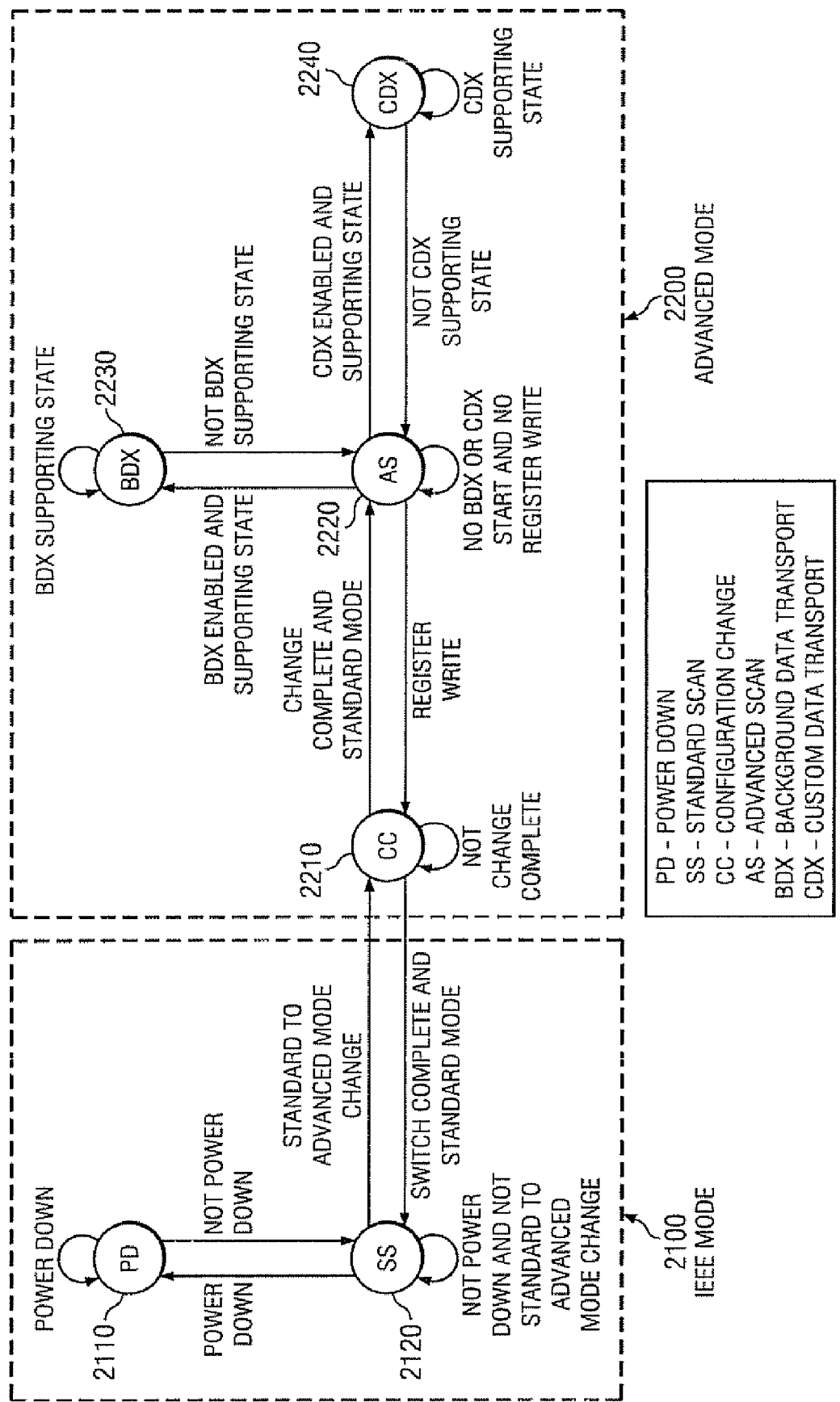
FIG. 9 illustrates a simplified state transition diagram showing the transitions between IEEE mode and standard mode in accordance with at least some preferred embodiments.

As already noted, the preferred embodiment of FIG. 3 is capable of multiple modes of operation. Each mode defines what protocol is used to communicate across the link 1300, and the overall behavior of the interface at the message packet level. FIG. 9 illustrates a simplified scan state diagram 2000 that shows the modes of operation of the state machine implemented within the DTS and TS cJTAG adapters 1110 and 1210 of the system 1000 (FIG. 3), in accordance with at least some preferred embodiments. Two modes are defined: standard (IEEE) mode 2100 and advanced mode 2200. The system starts up with the state machines of the cJTAG adapters in the power down ("PD") state 2110 and after powering up in IEEE mode is capable of performing standard (IEEE) JTAG operations within standard scan ("SS") state 2120. The cJTAG adapters change modes by transitioning to the configuration change ("CC") state 2210 whenever the format select register (FIG. 1A) is updated while in standard mode 2100 and a non-IEEE mode is selected. After entering the advanced mode 2200, basic cJTAG operations may be performed within advanced scan ("AS") state 2220.

Once in advanced mode 2200, any write to a register will trigger a transition to configuration change state 2210. If the write is to the format select register and results in a selection of IEEE mode, a transition back to the standard scan state takes place. Otherwise a transition back to advance scan state 2120 takes place. Other extended operations may be added to the basic cJTAG operations, and two such extended operational states are shown (background data transfer or "BDX" state 2230, and custom data transfer or "CDX" state 2240). The cJTAG adapters may be powered down after the state machines transition through the configuration state 2210 and the standard scan state 2120 and back to the power down state 2110. Further, additional modes beyond the standard and advanced modes of the preferred embodiment described may be defined, with transitions to and from these additional modes through change state 2210 implemented as described, and embodiments incorporating such additional modes are intended to be within the scope of this disclosure.

The configuration change state 2210 of FIG. 9 provides the hardware with extra time for the change in configuration necessary to support a new mode of operation to propagate and take effect. The configuration change state 2210 also provides a single, known transition point between the various modes. Although represented in FIG. 9 as single states, the states shown in FIG. 9 each represents specific transitions through multiple states of the TAP state diagram of FIG. 4. The states of FIG. 9 thus represent the overall system state, while the states of FIG. 4 represent the state of an individual TAP state machine.

The configuration change state 2210, however, is distinct from the other states of FIG. 9 in that the TAP state machine state sequences used to define configuration change state 2210 are the same regardless of the mode of operation of the system (e.g., standard mode and advanced mode). All other state transitions sequences are interpreted to indicate particular system states other than the configuration change state 2210 based not only upon the sequence through the state diagram of FIG. 4 (and thus of the TAP state machine), but based also on the mode of operation selected. Thus, a data scan that takes place in advanced mode (defined by specific state transitions of the TAP state machine as shown in FIG. 4)

will result in transitions through one particular set of states within FIG. 9, but that same data scan (defined by the same specific state transitions of the TAP state machine) will result in transitions through a different set of state within FIG. 9.

Figure 10A:
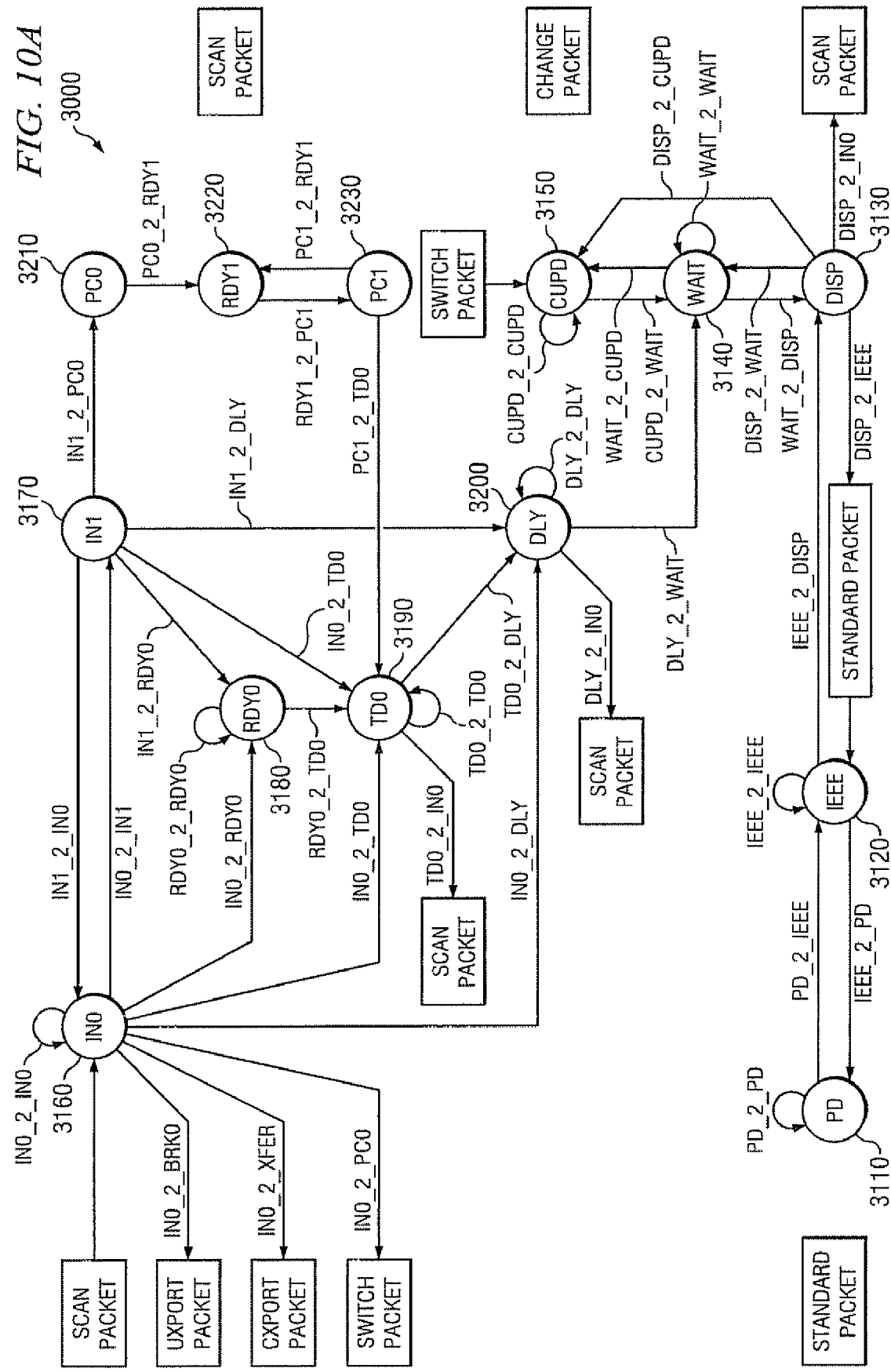

FIGS. 10A and 10B illustrate a more detailed cJTAG adapter scan state diagram 3000, in accordance with at least some preferred embodiments. Referring to FIG. 10A, the state machines of the TS cJTAG adapter 1220, for example, starts up in the power down ("PD") state 3110, transitioning to the standard mode idle ("IEEE") state 3120 after completing a power-on reset. When the TS cJTAG adapter 1220 receives a packet while in standard mode, the packet (i.e., information exchanged during one TAP state while in IEEE state) is forwarded to the TS TAP 1230 without modification by the TS cJTAG adapter 1220, and the state machine remains in IEEE state 3120. The zero-bit scans that open a command window are performed while in IEEE state 3120. Scan operations within the command window are also performed while in IEEE state 3120. If an operation specifies a change from IEEE mode to advanced mode, the interface operation must change. The packet initiating a change in interface operation from IEEE mode to advanced mode causes a transition from IEEE state 3120 to DISP state 3130, transitioning through change update ("CUPD") state 3150, wait state 3140 and dispatch state 3130, and into the advanced mode idle ("INO") state 3160, where advance mode processing begins. This transition does not close the command window, instead only changing the operating mode. The command window is closed by TAP state activity that results from the processing of advanced mode packets.

While in advanced mode, the packet content that is expected is determined by operations performed within the command window. When a cJTAG adapter receives an advanced mode packet, the state machine may transition to one of a variety of states depending on the type of packet expected, and on the TAP state associated with the expected packet. The state machine transitions through at least some of states 3170-3230 in a manner that depends on the advanced scan format specified in combination, in some cases, with the TAP state. In at least some of the preferred embodiments, the same packet format is used for all TAP states, while in at least some other preferred embodiments the packet content changes based upon the TAP state (e.g., less information is required to describe non-shift state activity, as compared to shift state activity). These scan types and their relationships to the state diagram are described in more detail below. If the packet is either a compressed export (CXPORT) packet or an uncompressed export (UXPORT) packet, the state machine transitions through at least some of states 3240-3310 (FIG. 10B). These data export operations and their relationships to the state diagram are described in more detail below. If the packet is a change packet (e.g., the end of a command window indicating a change from advanced mode back to IEEE mode), the change packet is processed, transitioning again through change update state 3150, wait state 3140 and dispatch state 3130, and back to the IEEE mode idle state 3120.

As already noted, the 2-wire physical interface provided under the cJTAG architecture requires that the data transferred across 4 or more wires be sent across the interface in the form of a serialized message packet. Data that would be sent across these wires under the JTAG architecture is instead sent as individual data bits within a cJTAG message packet. An example of such a serialized message packet is shown in FIG. 11. The packet shown includes bits representing the TDI, TDO and TMS signals of the JTAG interface, as well as additional bits used to implement additional features such as interlocked communications and delays. Not all operations require all of the bits shown in FIG. 11. To avoid sending bits that are not needed for a particular operation, at least some of the preferred embodiments define a plurality of scan types, each with different packet contents depending on what bits are to be used. By varying the bits included in the packet, different levels of optimization are possible.

Figure 12A:
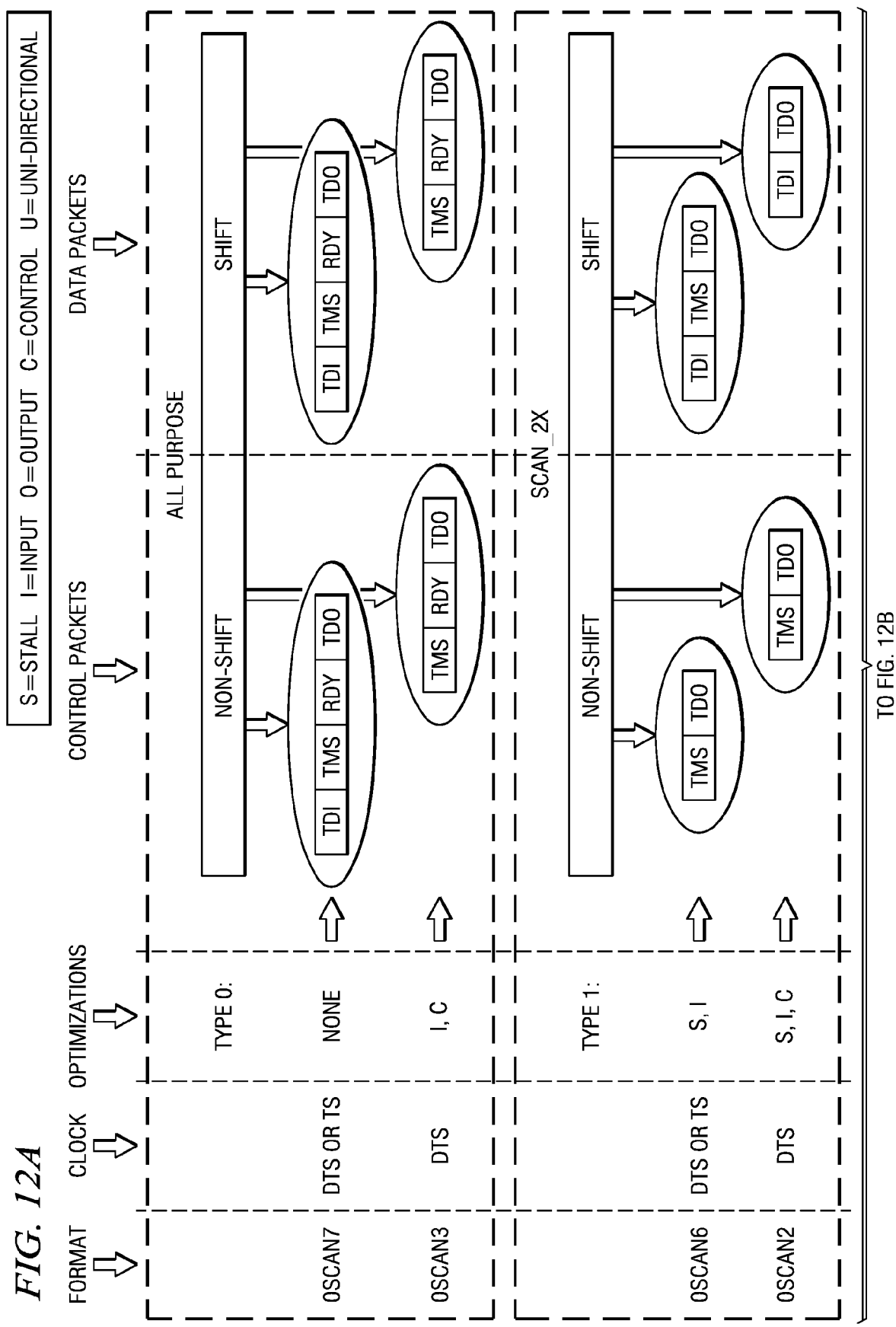
FIG. 12 illustrates examples of several different optimized scan message formats in accordance with at least some preferred embodiments.
Figure 12B:
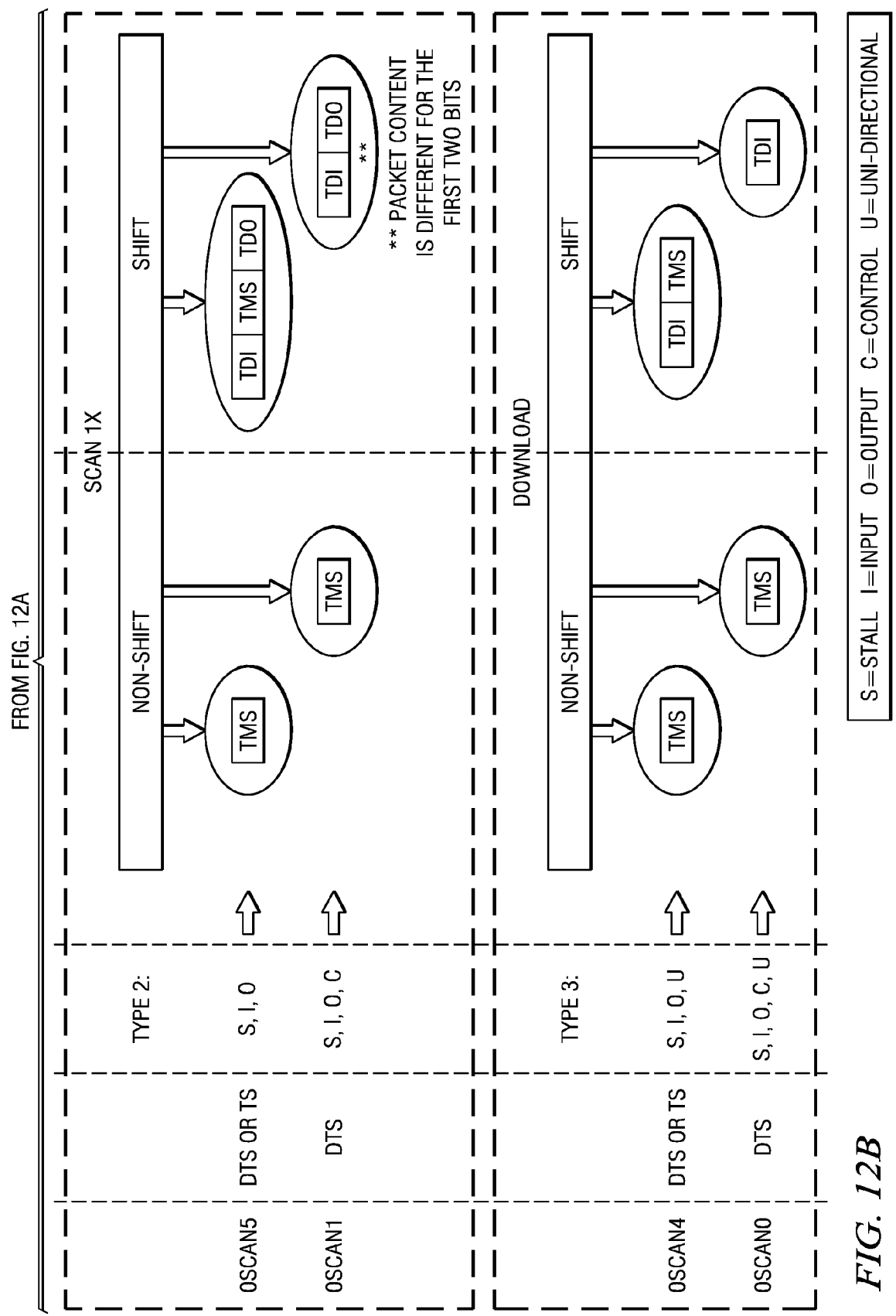

FIG. 12 illustrates several examples of optimized scans ("OScans"), in accordance with at least some preferred embodiments. Each of the OScans shown provides different combinations of bits, and thus different levels of optimization. For each Oscan, the chart indicates whether the clock is sourced by the debug test system or the target system, which bits are eliminated when not needed, and what the resulting control and data packets look like as a result of the optimization. The decision of when to omit a bit and utilize a particular OScan is based upon the JTAG standard, which specifies which bits are needed for particular operations defined by the TAG state diagram (FIG. 4). Thus, the states through which the TAP state machine transitions for a given OScan type will depend upon the data content defined for that OScan type.

OScan7 preferably provides no optimization and includes bits representing all of the signals of the JTAG architecture, plus a "ready" bit and one or more optional delay bits. This accounts for JTAG implementations that may not have followed the JTAG architecture as defined within the IEEE standard by, for example, transferring data on TDO or TDI during operations when the standard specifies that these signals are not used. Thus, OScan7 is provided for compatibility purposes, and not to result in any actual optimization.

Each of the remaining OScans results in a reduction in the number of bits transferred. In each case a given bit can be omitted because it is not needed for a given type of transaction. If, for example, data only needs to be transferred from a target system to the debug test system, there is no need to include the TDI bit which is used to transfer data from the debug test system to the target system. Similarly, the TDO bit is not needed for transfers from the debug test system to a target system. Ready bits (described below) are not needed if the target system is fast enough to keep up with the debug test system at the full TCK clock rate. TMS is not needed for long data transfers where an end of transfer escape sequence can be used (described below).

Referring again to FIG. 12, Oscan6 omits the TDI and ready bits from control packets and the ready bit from data packets. OScan5 omits all but the TMS bit from control packets and the ready bit from data packets. OScan4 omits all but the TMS bit from control packets and omits the TDO and ready bits from data packets. OScan3 omits the TDI bit from control packets and the TMS bit from data packets. OScan2 omits the TDI and ready bits from control packets and the TMS and ready bits from data packets. OScan1 omits all but the TMS bit from control packets and omits the TMS and ready bits from the data packets. OScan0 omits all but the TMS bit from control packets and all but the TDI bit from data packets. The delay bits are optional for all of these packets Although some of the formats described may be capable of one bit per data packet, two bits per data packet is a preferred configuration, as it permits maintaining a 2-to-1 ratio between cJTAG link clock and the JTAG clock on the IEEE busses (see FIG. 1). This permits the link to continue to operate at relatively high clock rates even when the debug test system, the target system, or both are slower, legacy systems.

Figure 13:
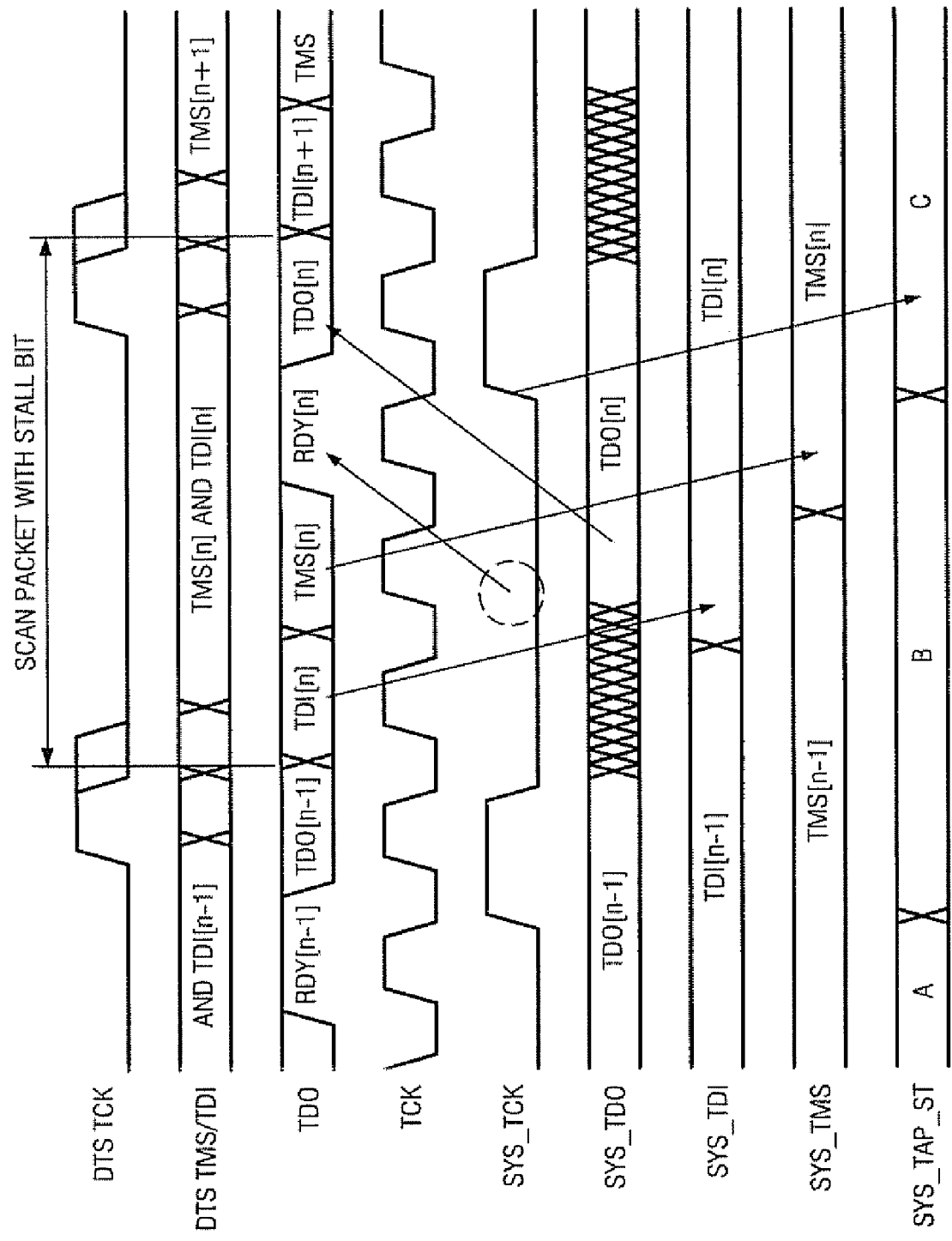
FIG. 13 illustrates the timing diagram for an example of an optimized scan without a scan stall in accordance with at least some preferred embodiments.
Figure 14:
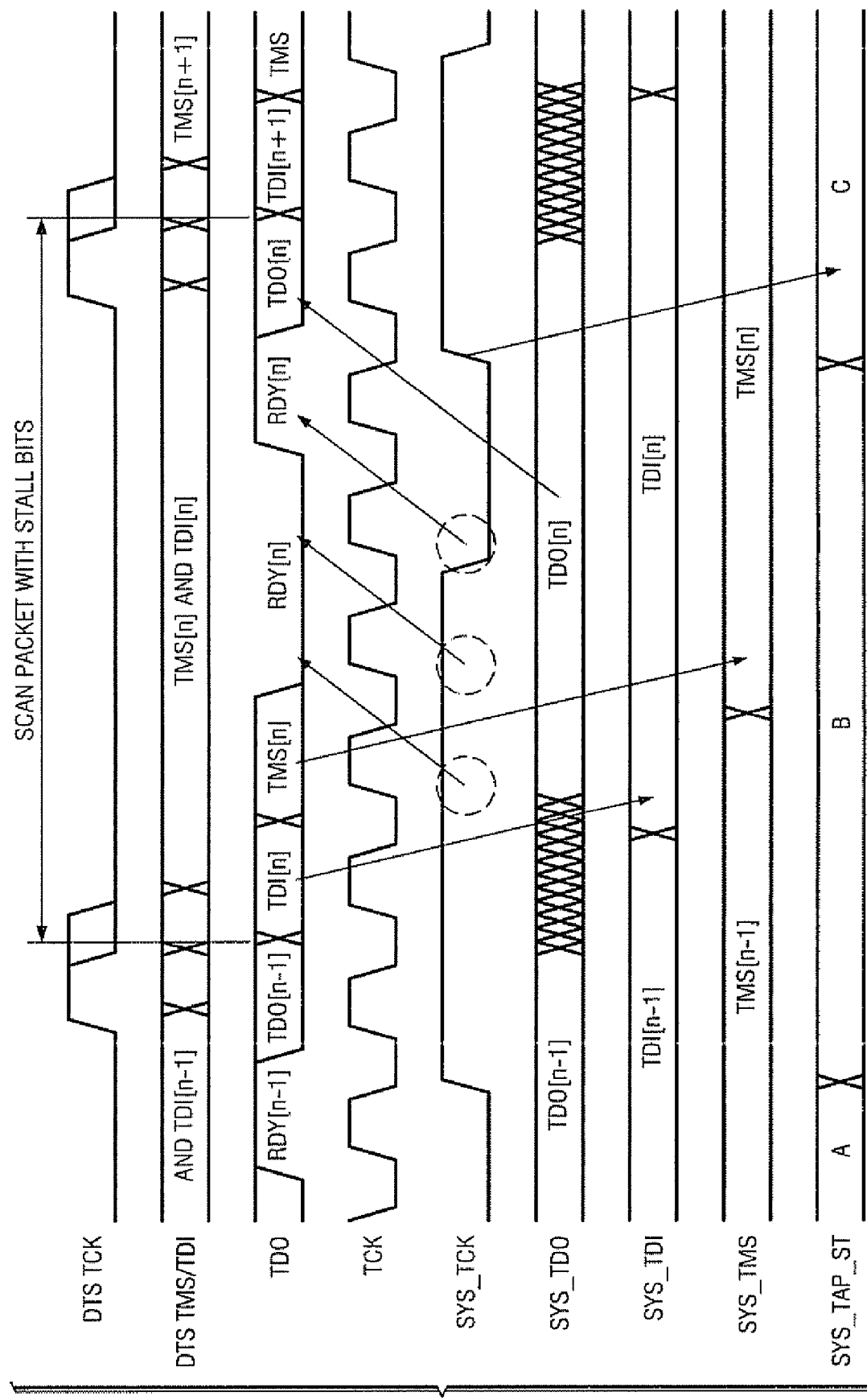
FIG. 14 illustrates the timing diagram for an example of an optimized scan with a scan stall in accordance with at least some preferred embodiments.

The OScans of the preferred embodiments also provide additional capabilities beyond the base JTAG architecture through the use of a ready bit. Because the data transferred between the debug test system and the target system in the cJTAG architecture is a serialized version of the signals defined in the JTAG architecture, it may be desirable to clock the serialized data at a higher clock rate to offset the effect of the serialization. But some target systems may not be fast enough to keep up with the higher clocking rates of the cJTAG architecture or may have limitations because of other factors, even when the interface is operated in a modified IEEE mode with a return TCK (RTCK) added to the four-wire IEEE interface. The ready bit provides a means for the target system to hold off the debug and test system and keeping it from sampling the TDO bit until the target system is ready and the TDO bit from the target system is valid. As shown in FIG. 13, if the ready bit is set, the next bit sent is the TDO bit from the target system. FIG. 14 illustrates the case where the target still stalls the debug test system. The ready bit indicates the packet may proceed, and the next bit sent is a repeat of the ready bit rather than the TDO bit. The ready bit continues to be repeatedly sent until the ready bit is cleared, at which point the TDO bit is sent from the target system to the debug test system.

In at least some preferred embodiments, the ready bit may be implemented in at least two different configurations. In the first configuration, two or more target systems may assert the ready bit. In this configuration, the TMSC signal is pre-charged by the debug and test system during the bit cycle preceding the bit cycle assigned to the ready bit. If any one of the target systems is not ready to output its TDO, that target system pulls the TMSC signal low during the ready bit time period, indicating that a stall is needed (ready not asserted). This operation of the ready bit is shown in the scan state transition diagram of the preferred embodiment of FIG. 10A. When a scan packet that includes a ready bit is received in advanced mode the state machine of a cJTAG adapter receiving the packet transitions from advanced mode idle state ("IN0") 3160, where it process the first packet bit, to the first MScan pre-charge state (PC0) 3210. The state machine then transitions to MScan ready state (RDY1) 3220, and subsequently to the second MScan pre-charge state (PC1) 3230. If the TMSC signal has been pulled low during the ready bit time period (ready not asserted), the debug and test system again pre-charges the TMSC signal and the state machine returns to MScan ready state 3220. This process repeats until the ready bit is asserted by a target system (not pulled low), causing the state machine to transition to the TDO processing state 3190, where the TDO bit is sampled and received by the debug and test system.

In the second configuration, only a single selected device is involved in the data exchange, precluding the need for a pre-charge/discharge configuration. Instead, the targets system simply drives the ready bit to the desired state. Referring again to the preferred embodiment of FIG. 10A, when a scan packet that includes a ready bit is received in advanced mode the state machine of a cJTAG adapter receiving the packet can transition from advanced mode idle state ("IN0") 3160, where it process the first packet bit, to either input/output processing state ("IN1") 3170, where it would process the second packet bit if included, or to OScan ready state ("RDYO") 3180. If there is no second packet bit prior to the ready bit, the state machine can transition directly from the advanced mode idle state 3160 to the OScan ready state 3180. If the ready bit is not set, the state machine will hold in the OScan ready state 3180. Once the ready bit is set, the state machine then transitions to the TDO processing state ("TDO") 3190, where the TDO bit is sampled and received by the debug and test system It should be noted that because each target system of the preferred embodiments controls its own ready bit, the duration of the stall for each target system is determined by that target system, and thus each target system may stall the debug and test system for a duration of time specific to that target system (or no stall at all) without regard to the stall requirements of any other target system coupled to the debug and test system.

The OScans of the preferred embodiments may also provide for additional transmission delays through the use of delays between packets. Either a fixed or variable number of delay cycles may be introduced between the end of one packet and the beginning of another packet. FIG. 15A illustrates the transmission of a fixed delay. In the example shown, a fixed delay of two clock cycles (TCK cycles) is introduced between two scan packets. In at least some of the preferred embodiments, the duration of the clock cycles is determined by programming two bits within a cJTAG delay control register within the cJTAG adapter of the debug test system. A delay of 0, 1, and 2 clock cycles may be selected by setting the delay control bits, for example, to the binary values 00, 01, and 10 respectively, as shown in the table of FIG. 15B. Each value corresponds to the addition of 0, 1, or 2 clock cycles of delay. Thus, in the example show in FIG. 15A, the delay control register was set to a binary value of 10 (decimal 2), resulting in the two additional delay periods shown.

Figure 16B:
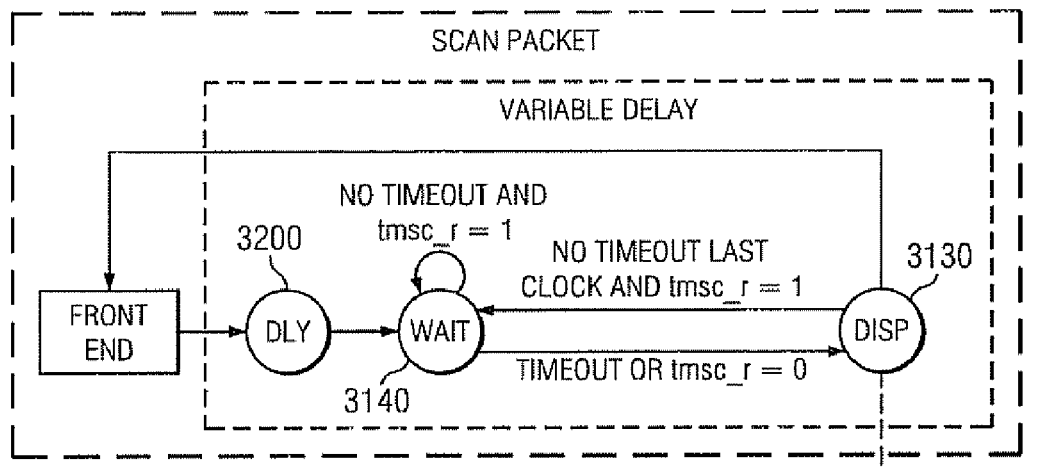
FIG. 16B illustrates the state transition diagram for extending a delay between scan messages in accordance with at least some preferred embodiments.

FIG. 16A illustrates how delays between packets that are of variable length may also be provided. In at least some of the preferred embodiments, loading a binary value of 11 into the a cJTAG register control registers enables variable delays and configures the delays between packets to be controlled by the state of the TMS bit. The sequence of events is shown in FIG. 16B, which is a simplified partial state transition diagram derived from the scan state transition diagram of FIG. 10. After the initial delay state ("DLY") 3200 is reached, the state machine of the cJTAG adapter transitions to wait state ("WAIT") 3140. As long as the TMS bit is set, the state machine will remain in wait state 3140. When the TMS bit is cleared, the state machine will transition to the dispatch state 3130 and the cJTAG adapter will then resume processing advanced mode scan packets if the TMS bit remains cleared.

In the preferred embodiments illustrated in FIGS. 15A and 16A, the data driven on the TMSC signal is the data last driven during the previous scan cycle. During the delay (fixed or variable) this data is treated as "don't care" data. In at least some preferred embodiments this data may instead be affirmatively driven by either the debug and test system or the target system with other useful information. Additional JTAG signals such as, for example, the boundary check enable (BCE) signal and the test reset (TRST) signal may be driven by the debug and test system. Other data that can be driven onto the TMSC signal during delay periods may become apparent to those skilled in the art, and all such data is intended to be within the scope of the present disclosure.

In at least some of the preferred embodiments a timeout mechanism is included that forces the state machine of FIG. 16B to reset all cJTAG control registers to their power-on reset values and return the cJTAG state machine to IEEE mode. The criteria for triggering this timeout is based on a predetermined number of consecutive clock cycles (e.g., 64 clock cycles) during which the TMS bit remains a one. If the TMS bit stops transitioning at least one of the cJTAG adapters is presumed to have stopped operating properly, warranting a reset of the cJTAG interface. As described above, variable delays are achieved by holding the TMS bit to a one. The timeout mechanism thus limits a variable delay cycle to less than the timeout clock count.

To extend the delay times that are possible, at least some of the preferred embodiments implement a delay extension mechanism, which is also shown in FIG. 16B. Assuming, for example, a timeout above 64 consecutive clock cycles, if the TMS bit is held high for no more than 64 clock cycles, thus transitioning the state machine from the wait state 3140 to the dispatch state 3130 on the 65$^{th}$ clock cycle, the TMS cycle may be set to a one again, sending the state machine back to wait state 3140. No timeout will occur and the delay has now been extended for up to another 64 clock cycles. This extension sequence may be repeated as many times as necessary. In at least some preferred embodiments, the timeout is set to expire above 2 clock cycles, and the TMS bit alternates between a one and a zero. Referring to the state machine of FIG. 16B, this causes successive transitions between wait state 3140 and dispatch state 3130. But because the timeout is set to expire above 2 clock cycles, a timeout will occur within one clock cycle of a failure by the TMS to transition. This allows for relatively long, and even indefinite, delay periods, while also providing a relatively quick timeout response. Other configurations may become apparent to those skilled in the art, and all such configurations are intended to be within the scope of the present disclosure.

As already noted, the purpose of the OScans is to provide a way for transmitting only that data that is needed and omitting bits of data that are not needed for a particular transaction. For bits like TDI and TDO this means not including the information within the packet. But unlike the TDI and TDO bits, the TMS bit is used to determine the state transitions that occur in both the TAP and cJTAG state machines. For OScans packets that move data (i.e., packets associated with shift states), and that include the TMS bit, the TMS bit is low in each packet until the end of the transfer, and then set high within the last packet. For OScans where the TMS bit is excluded, at least some of the preferred embodiments use an alternative mechanism that signals the end of the transfer without using the TMS bit.

Figure 17:
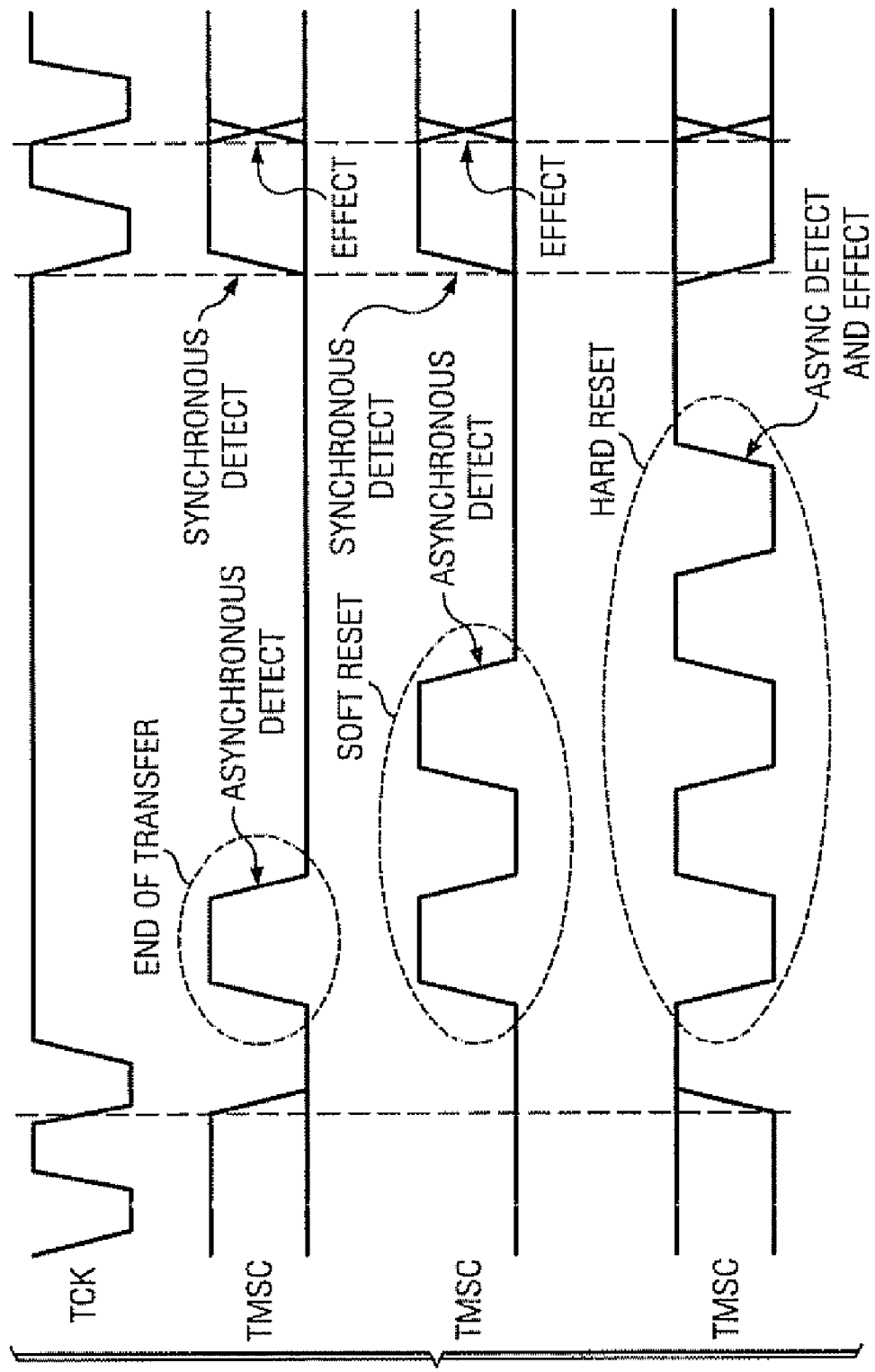
FIG. 17 illustrates the timing diagram for several escape sequences in accordance with at least some preferred embodiments.

FIG. 17 illustrates how the TCK and TMS signals are used to create an end-of-transfer escape sequence that is detectable by a cJTAG adapter but has no effect on a JTAG TAP state machine. In the preferred embodiment of FIG. 17, serialized data is transferred between the debug test system and the target system using the TMS signal and clocked between the systems using the TCK signal. At the end of an OScan that omits the TMS bit within the packet transferred, the TCK signal is held high by the DTS cJTAG adapter, which keeps any TPA state machine that is coupled to the TMS and TCK signals from transitioning states. The TMS signal is then subsequently set to the inverse of its last state by the DTS cJTAG adapter, and then pulsed while the TCK signal continues to be held high. A TS cJTAG adapter coupled to the TMS and TCK signals counts the pulses. After the pulsing completes, the TMS signal is returned to its initial value at the start of the escape sequence and the clock is restarted. One clock cycle later, the escape sequence takes effect. Although the escape sequence of the preferred embodiment described uses the TMS signal for transferring data, any other non-TCK signal may be used, as well as any other combination of signals other than TMS and TCK, and the present disclosure is intended to encompass all such embodiments.

As illustrated in FIG. 17, the escape sequences of the preferred embodiments can be used for purposes other than just an end-of-transfer indication. Both a soft reset and a hard reset are shown. Each uses a different number of pulses to indicate which function is desired. Further, the hard reset sequence does not require that the clock resume, allowing a full reset of the cJTAG link even after a failure of the clock to resume. Many other functions can be added by adding additional pulse counts, and the present disclosure is intended to encompass all such functions. Within at least some of the preferred embodiments, any additional functions would be implemented with a lower pulse count than soft and hard reset. In this way hard reset always requires the highest pulse count and would be triggered without having to restart the clock and also would be triggered if the TMS signal gets stuck in a continuous toggle.

As described above, both soft and hard reset escape sequences are implemented in at least some of the preferred embodiments. A soft reset escape sequence is used to place an offline cJTAG adapter back online. The soft reset escape sequence is ignored unless the cJTAG adapter is operating in advanced mode and is in a state that allows a soft reset. A soft reset escape sequence is allowed immediately after a register write while in advanced mode, and anytime if the cJTAG adapter has been placed offline by enabling an unsupported feature. The soft reset places the cJTAG adapter into IEEE mode, deselects the cJTAG adapter, and closes any open command windows, but does all this without re-initializing any other part of the cJTAG adapter. A hard reset escape sequence provides the same functionality as a JTAG test reset or a JTAG boundary compliance enable. A hard reset asynchronously changes the system state in either IEEE mode or advanced mode. A hard reset may be generated independent of the cJTAG adapter state. In at least some preferred embodiments, a hard reset is never ignored.

As illustrated in FIG. 12, different OScans are used depending on the source of the clock signal used for the cJTAG link. OScans 0-3, for example, are not allowed if the target system sources the clock. This is due to the fact that the data packets for these OScans do not include the TMS bit, and thus require the use of an end of transfer escape sequence. In order for the debug test system to signal the end of transfer, the debug test system must control the clock. In at least some of the preferred embodiments the DTS cJTAG adapter can check a register within the cJTAG adapter to determine the currently configured clock source. The contents of this register are determined upon initial power up of the system. Upon power-on reset, the debug and test system initially maintains the TCK and TMSC signals tri-stated. Thus, until these signal are enabled, any activity on the part of the debug and test system does not affect any target systems to which the debug and test system is coupled. This allows the debug and test system to sequence through any states required for to determine its own configuration and to properly initialize itself. Once properly initialized, the debug and test system can selectively enable the TCK and/or TMSC signals to determine if there are target systems driving the clock signal, thus allowing the debug and test system to store in the register the clock source configuration. If an OScan is requested that requires that the debug test system source the clock, but the target system is configured to source the clock (based on the detected and saved configuration), a compatible OScan will be used instead (i.e., one of OScans 4-7), regardless of the OScan that is requested. It should be noted that although the above preferred embodiments are described from the perspective of the data and test system, the target system of at least some preferred embodiments is also capable of making such a determination of the clock configuration and of adjusting the OScan format used according to the source of the clock.

The debug and test system of at least some preferred embodiments may also selectively enable other signals, such as TDI and TDO, and based upon the response of one or more target systems, as detected by the debug and test system, the topography of the system (e.g., series, wide star, or narrow star) can be determined. For example, if the debug and test system leaves TDI tri-stated, but detects that it is at a logical 0 level (pulled low) then system is in a two-wire configuration which means that there are not JTAG devices (ie., two-wire narrow star configuration). A variety of bit sequences may be output by the debug and test system on the various signals of the link 1300 coupling the debug and test system 1100 and one or more target system (e.g., target system 1200) of the preferred embodiment of FIG. 1. The response by the target systems, as detected by the debug and test system eventually allow a determination of the topology of the system. Sequences may be selected such that a response corresponding to each configuration is expected. If an expected response is not received to a bit sequence corresponding to one configuration, another sequence corresponding to another configuration is attempted. This process is repeated until the configuration is identified. If no matching configuration is identified, the interface is declared inoperative. Many different bit sequences and signal selections are possible to this end, and all such sequences and selections are intended to be within the scope of the present disclosure.

Another extension to the JTAG architecture added by the cJTAG architecture of at least some of the preferred embodiments is the ability to select and de-select cJTAG systems without affecting JTAG target systems that are also present in the system. A cJTAG target system can be de-selected by placing the target system in global bypass mode. In global bypass mode the cJTAG adapter halts the clock provided to the target system TAP, which prevents the TAP state machine from changing state until re-selected. The cJTAG global bypass mode is similar to the JTAG bypass mode in that all data is routed through the 1-bit global bypass register, as show in FIG. 18, until it is again selected. But unlike the JTAG bypass mode, global bypass mode also results in all instructions being routed through the 1-bit global bypass register as well.

Selection of a cJTAG target system is a two-step process that includes a pre-selection of the desired cJTAG target systems, followed by activation of the pre-selections 1 clock cycle after entry by the target system TAP into the run-test/idle state (see FIG. 6A). As previously noted, de-selection of a target system blocks the clock signal to the target system TAP. The TAP, which is left in the run-test/idle state after de-selection, does not sequence any further after de-selection because it is no longer receiving a clock signal. By splitting the selection into a pre-selection that blocks the clock, followed by activation of the pre-selections which re-enable the clock, multiple target systems may be pre-selected in sequence, followed by a single activation that triggers all the pre-selects together. The pre-selects will all go into effect 1 clock cycle after the activation. The effect is to create a global selection of multiple target systems coupled to a single port of the test data system. Although the above description is in the context of a global selection, this same process may be used to implement a variety of global commands, and all such global commands are intended to be within the scope of the present disclosure.

Global selection of multiple target system can be expanded to operate across multiple ports. In at least some preferred embodiments, the debug test system may have multiple cJTAG ports that each couple to multiple target systems. In such preferred embodiments, the ports may be enabled and disabled through a single control register within the debug test system. After the target systems of a port are de-selected, the port itself is disabled. Each port is then enabled in sequence, and while enabled the above described pre-select sequences are performed on one or more target systems. After pre-selects of the desired target systems have been performed on one port, but before activation, the port is disabled as a second port is enabled. The pre-selection process is then repeated for target systems coupled to the second port, and then again for each successive port. Once all ports have been processed and all the desired target systems on all ports are pre-selected, the ports are all enabled together and all of the target systems are activated at once. The effect is to create a global selection of multiple target systems coupled to multiple ports of the debug test system. As before, although the above description is in the context of a global selection, this same process may be used to implement a variety of global commands, and all such global commands are intended to be within the scope of the present disclosure.

In at least some of the preferred embodiments, as previously noted, a debug test system may be coupled to one or more target systems in either a serial or star configuration. In the series configuration shown in FIG. 2B, both JTAG and cJTAG target systems may be present. The commands used to select a cJTAG target system (pre-selection and activation) in a series configuration are advanced mode commands that are ignored by JTAG target systems as no-ops. Advanced mode commands may also be used to perform a global select of the cJTAG target systems. This is accomplished by designating one of the advanced mode commands for this purpose, which when received by a cJTAG target system causes it to treat the next advanced mode command as selection information, even if the cJTAG target system is in a bypass or global bypass mode. The information thus provided determines with cJTAG target systems are selected, and which are not selected.

Figure 19:
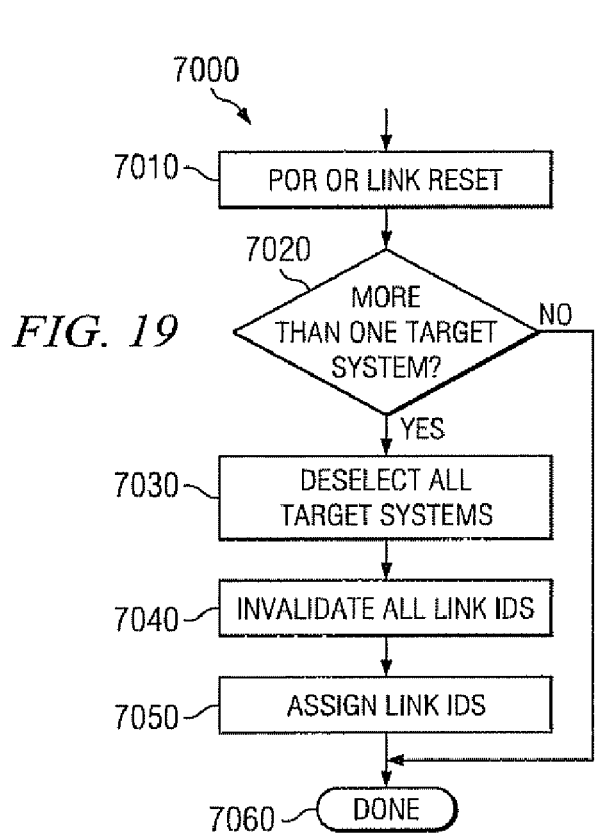
FIG. 19 illustrates a method for assigning link IDs within a cJTAG enabled system in accordance with at least some preferred embodiments.

In the star configurations shown in FIG. 2B, all of the target systems must be cJTAG target systems. In order to address cJTAG target systems in a star configuration, each cJTAG target system must have a unique adapter ID that allows it to be accessed exclusively at a given point in time. To accomplish this, at least some of the preferred embodiments utilize a 4-bit link identifier which is dynamically assigned by the debug test system to each target system. FIG. 19 illustrates how an ID is assigned to each cJTAG target system. The assignment method 7000 begins with either a power-on reset or a reset of the link coupling the debug test system and target systems to each other (see Wide Star configuration, FIG. 2B), as shown in block 7010. In this state each target system defaults to a link ID of 0, blocks link ID assignment by setting its individual scan status to zero, forces the use of Multi-device Scans ("MScans"), and becomes de-selected. If there is only one target system coupled to the debug test system (block 7020), no ID assignment is necessary and the ID assignment method 7000 is done (block 7060). Operation may begin by selecting the target system with ID zero, and by using MScans (described below) to access the target system.

If there is more than one target system (block 7020) then all of the target systems are de-selected (block 7020) and the link IDs of all of the target systems are invalidated by setting the scan status of each target system to one (block 7030). In at least some of the preferred embodiments the de-selection and invalidation blocks are implemented with advanced mode command sequences that use commands such as those listed in FIG. 8B. Referring again to FIG. 19A, once de-selection and invalidation are complete, ID assignment can proceed (block 7050), completing the method 7000 (block 7060).

Figure 20:
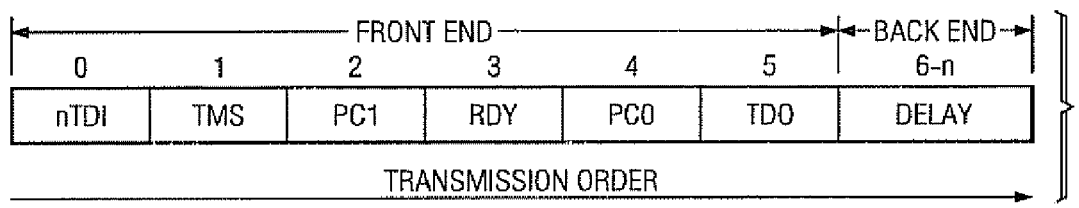
FIG. 20 illustrates an example of a multi-device scan message format in accordance with at least some preferred embodiments.

As already noted the target systems initially are forced to use MScans. FIG. 20 illustrates the basic data format for an MScan message. Though very similar to the previously described OScan7 message format, the MScan has two additional bits, pre-charge bits 0 and 1 ("PC0" and "PC1"). The ready and TDO bits of at least some of the preferred embodiments are driven by the target systems. But in the star configuration, with multiple target systems coupled to a single debug test system, it is possible for multiple target systems to sometimes attempt to output the ready ("RDY") or TDO bits at the same time, creating a signal conflict on the TMS signal line. To prevent this conflict, the target systems drive the TMS signal line with the ready and TDO bit information using a pre-charge/discharge signal drive configuration, together with bus-keeper latches, when using MScans.

FIG. 21 illustrates the hardware configuration used to prevent bus conflicts on the TMS signal line 1320 together with the MScan format. Referring to both FIGS. 20 and 21, the pre-charge one ("PC1") bit, which is always a binary one, is output by the DTS TMS driver 1160 and loaded into keeper latch 1370. A keeper latch is a latch with an output driver that is significantly weaker than other output drivers coupled to the same signal as the input and output of the keeper latch 1370. When DTS TMS driver 1160 outputs a signal, it will overcome the drive of the keeper latch 1370, if they are driving opposite states, and keeper latch 1370 will change state accordingly. In the absence of any drive on the TMS signal line 1320 output driver 1160, keeper latch 1370 will maintain or "keep" the latched bit driven on the signal line. During the TDO bit cycle time, if either target system 1 ("TS 1") or target system 2 ("TS 2") outputs a TDO value of zero, the corresponding pull-down gate (1450 or 1550) will drive the TMS signal line 1320 low, causing keeper latch 1370 to also change to a zero. If neither target system drives TMS signal 1320 to a zero, it will remain in the kept state, which is the logical one driven onto TMS signal 1320 during the PC1 bit cycle. This same mechanism is also used with the ready bit, in combination with the pre-charge zero ("PC0") bit.

Figure 22A:
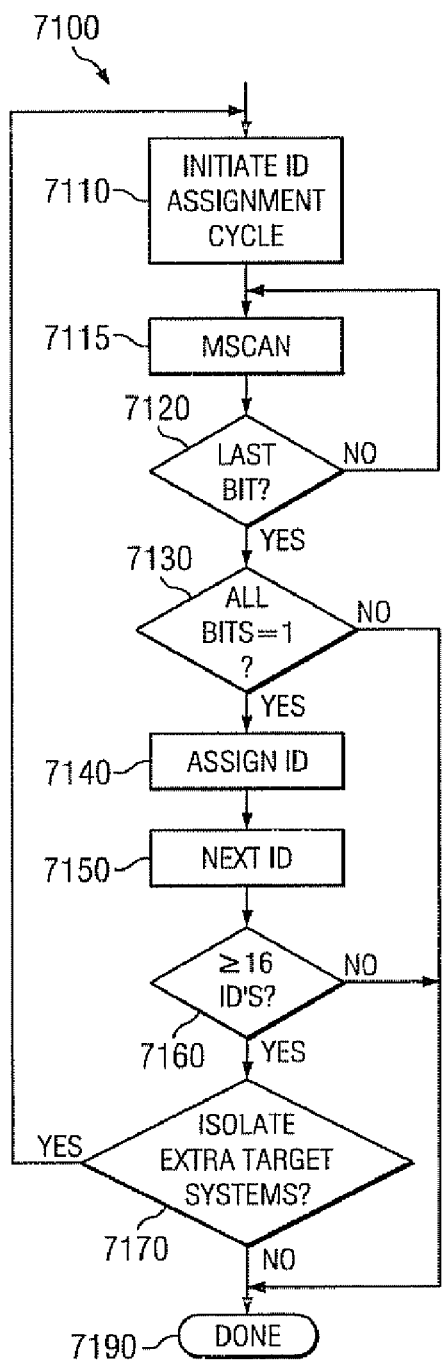
FIG. 22A illustrates a method implemented in a debug test system for assigning link IDs in accordance with at least some preferred embodiments.

By taking advantage of the "wire-OR" configuration of TMS signal 1320 and the MScan format, individual target systems may be isolated and subsequently assigned a unique link ID. FIG. 22A illustrates a debug test system ID assignment method 7100, in accordance with at least some preferred embodiments. After sending an advanced mode command sequence to all coupled target systems to initiate an assignment cycle (block 7110), the debug test system begins initiating a series of MScans (block 7115) in which one or more of the target systems output bits from a unique isolation pattern. An isolation pattern is a unique identification number associated with each target system. FIG. 23 illustrates an example of an isolation pattern, in accordance with at least some preferred embodiments, comprising a node ID, a part number, a manufacturer's ID, and a zero for the last bit. The part number combined with the manufacturer's ID and the last bit (set to zero) is a 28-bit identifier that is sometimes referred to as the JTAG ID. The 4-bit node ID provides a means for identifying a target system when two target systems have the same JTAG ID. Other techniques for generating unique isolation patterns for each target system will become apparent to those skilled in the art, and the present disclosure is intended to encompass all such techniques.

The debug test system waits for the last MScan bit of the isolation pattern to complete (block 7120) and then checks to see if all bits including the last bit are a one (block 7130). If all bits are a one, the pre-charge has not been pulled down by any of the target systems, all have been assigned a link ID, and the assignment method 7100 has completed (block 7190). Otherwise a target system has pulled down the pre-charge of at least one bit, has been isolated, and the debug test systems assigns a link ID to the isolated target system (block 7140). The debug test system then increments the link ID (block 7150) and checks to see if the link ID equals or exceeds 16 (block 7160). If so, more than 16 link IDs have been assigned. The debug test system then checks to see if it is configured to continue to isolate the additional target systems coupled to the debug test system (block 7170). If more than 16 target systems are coupled to the debug test system, it may become necessary for at least some of the target systems to share link IDs. If the debug test system is configured to share IDs, the extra target systems may optionally be isolated as well so that additional processing may be performed later to share link IDs between two or more target systems (described below).

Figure 22B:
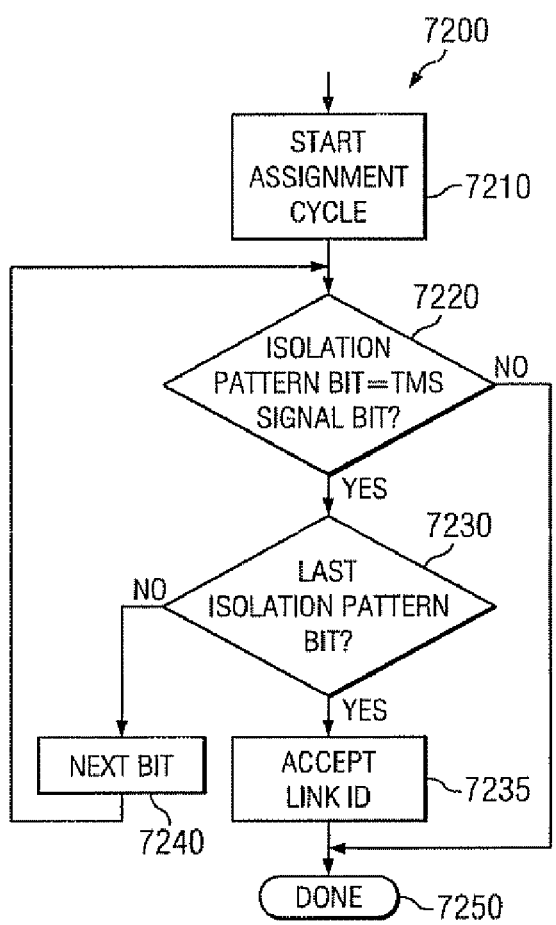
FIG. 22B illustrates a method implemented in a target system for assigning link IDs in accordance with at least some preferred embodiments.

FIG. 22B illustrates a target system ID assignment method 7200 corresponding to the debug test system assignment method 7100, and in accordance with at least some preferred embodiments. After an assignment cycle has been started (block 7210) and MScans are being generated, the target system begins outputting each bit of its assigned isolation pattern during the TDO bit period of each MScan. If the target system detects a discrepancy between the TDO bit value output by the target system and the binary value present on the TMS signal line (block 7120) for any given bit of the isolation pattern, the target system will exit (block 7250) and cease participating in the current ID assignment cycle. If the binary value present on the TMS signal line matches the TDO bit value output by the target system, the target system checks to see if the current bit is the last bit of the isolation pattern (block 7230). If the current bit is the last bit, then the target system has been isolated and is assigned a link ID (block 7135), and the current assignment cycle ends (block 7250). Otherwise the next bit is output (block 7240) and the process is repeated for each bit (e.g., 32 bits in at least some preferred embodiments).

As already noted, it is possible to have more target systems coupled to the debug test system in a star configuration than can be accommodated directly by the bit-width of the assigned link IDs. In at least some of the preferred embodiments, default link IDs may be assigned at power-on reset up to the maximum available, or may be assigned after power-on reset through a link ID assignment process that allows for sharing of link IDs. Sharing is accomplished by determining the number of target systems coupled to the debug test system, invalidating the link IDs of, and selectively de-selecting, some target systems while expressly assigning link IDs to the remaining target systems, such that the total number of assigned link IDs never exceeds the maximum number of available link IDs. To accomplish such an express ID assignment, a command level is defined for at least some of the preferred embodiments wherein the target systems are blocked from outputting the TDO bit (e.g., command levels 3, FIG. 8A). During an assignment cycle, the debug test system acts as a surrogate for the target system expressly being assigned a link ID, and outputs the isolation pattern of behalf of the target system. By outputting the target system's isolation pattern, the desired target system will be the system remaining at the end of the ID assignment cycle, expressly forcing the assignment of the link ID to the desired target system.

As already noted once all the available IDs have been assigned, the debug test system can detect that there are still additional target systems requiring a link ID. By going through additional assignment cycles, the debug test system can count the number of target systems in excess of the available link IDs. Further, the isolation patterns for the "extra" adapters may be saved for future use in resolving the link ID shortage (e.g., by using the sharing scheme described above). In at least some of the preferred embodiments, a single link ID is used over and over again upon initial assignment, and all of the adapters share that common ID until the debug and test systems changes or invalidates the ID.

The cJTAG adapters of at least some preferred embodiments are also capable of supporting non-scan data transfers between the debug test system and one or more target systems. These background data transfers (BDX) take advantage of the time that the target system TAPs spend in one of several BDX-supporting states such as, for example, the run-test/idle, pause_DR, and pause_R states (see FIG. 4). The transfer substitutes BDX information in lieu of the scan packet normally associated with a target system TAP state. A background data transfer may be enabled by a control register write performed after the target system has been in the BDX-supporting state for at least one scan packet cycle associated with the supporting TAP state. Once a background data transfer has started, the target system TAP state is advanced by each background data transfer. The selected target system transfers data while unselected target systems transition through the same states as the target system transferring data, but without actually participating in the transfer. This keeps the TAP states of the target systems synchronized. The background data transfer is terminated upon exit from the supporting state. Data may be transferred exclusively in one direction (to the target system, or to the debug test system), or alternately in both directions (bidirectional transfer). The bandwidth allocation of a bidirectional transfer in at least some of the preferred embodiments is 50/50, but other allocations are possible and all such allocations are intended to be within the scope of the present disclosure.

Figure 25:
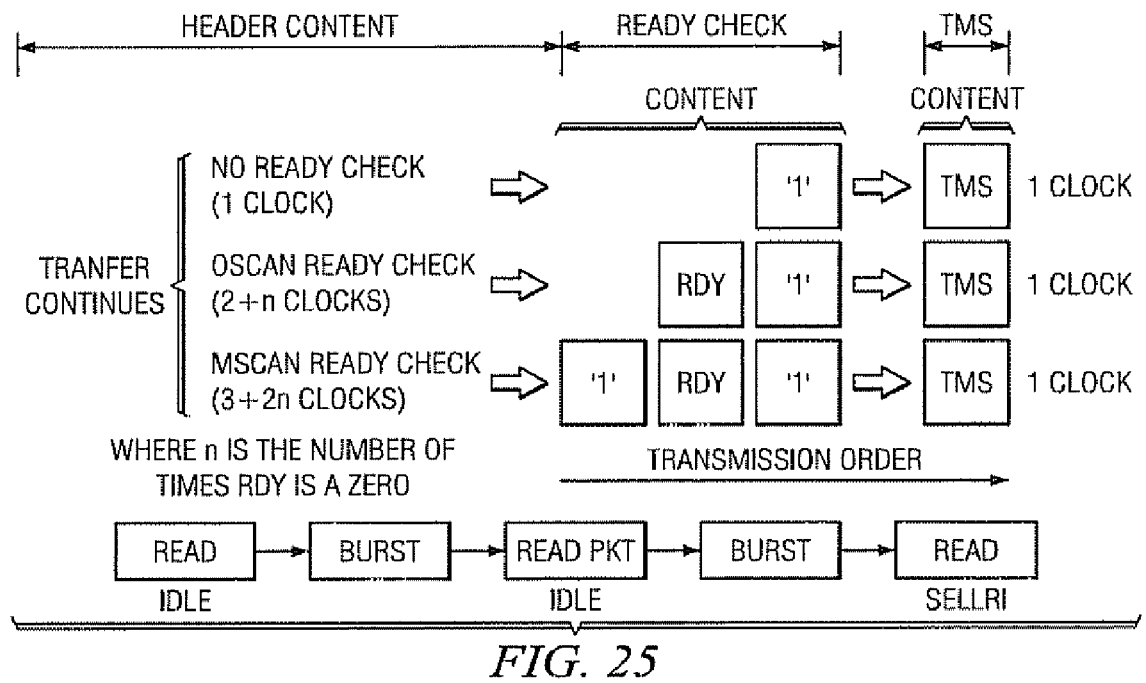
FIG. 25 illustrates an example of a burst background data transfer message header in accordance with at least some preferred embodiments.

Two types of background data transfers, burst and continuous, are defined for at least some of the preferred embodiments. FIG. 24 illustrates the format of a burst background data transfer. As shown, the first burst packet of a newly activated transfer skips the header and begins with an abbreviated scan packet followed by burst data packets. Subsequent packets include the header, which is formatted depending on the scan format in effect prior to activating the background data transfer. FIG. 25 illustrates several different header configurations, in accordance with at least some preferred embodiments, as well as the association between the header configurations and the cJTAG scan formats. When scan formats that support the use of scan stalls or delays are in use, the background data transfer will also support such stalls and delays using the same mechanisms as those defined for the scan format. Although the burst data packets of the preferred embodiments are of fixed bit sizes (e.g., 8, 16, 32, or 64 bits), other bit widths may be used and the present disclosure is intended to encompass burst packet sizes of all such bit widths. Other preferred embodiments may insert advanced mode packets (e.g., MScans and OScans) instead of the headers illustrated in FIGS. 24 and 25.

Figure 26:
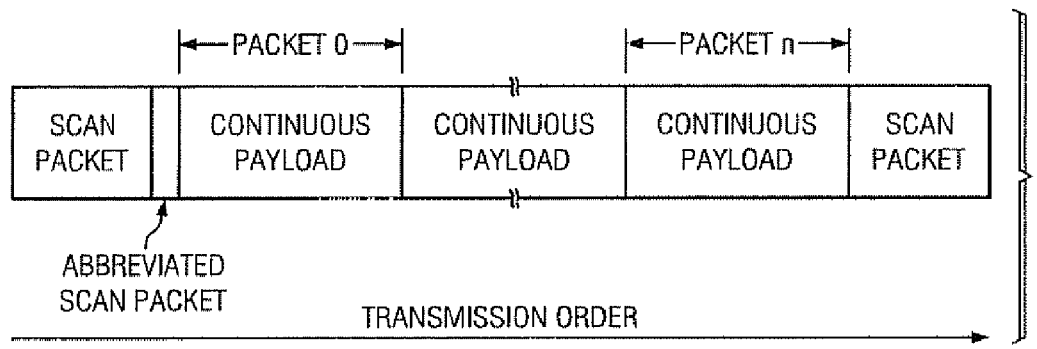
FIG. 26 illustrates an example of a continuous background data transfer message format in accordance with at least some preferred embodiments.
Figure 27:
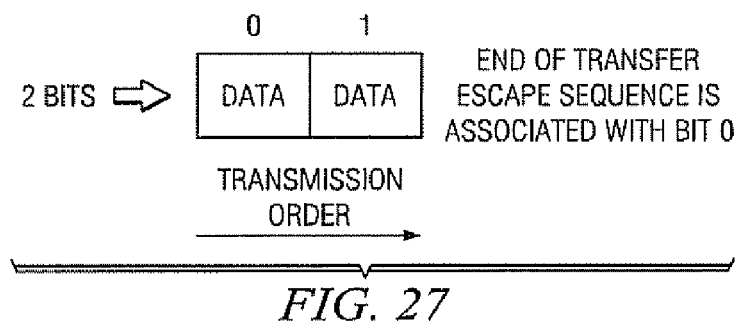
FIG. 27 illustrates an example of a continuous background data transfer message payload format in accordance with at least some preferred embodiments.

It should be noted that the TMS bit of the burst background data transfer header is driven by the debug test system, while the bits associated with the ready check, are driven by the target system participating in the transfer. This is done in order to protect against a disconnect of the TMS signal between the debug test system and the target systems. Referring to FIG. 21, if such a disconnect occurs, the logic "1" driven by the active target system at the end of the ready check sequence of the BDX header will be maintained by keeper latch 1370. As a result, when the debug test system fails to drive the TMS bit to a logic "0," TMS will be seen as a logical "1," the target system TAP state machines of all the target systems will exit the BDX-supporting state, and the background data transfer will end. Further, because a logical "1" continues to be present on the TMS signal 1320, the target system TAP state machine of all the target systems will eventually sequence back to the test-reset/idle state (see FIG. 4), which causes the target system's TAP to revert to a known, stable state, thus providing TAP synchronization in the event of a disconnect This will only happen, however, if the target system is sourcing the clock, or if the debug test system is sourcing the clock and has not also been disconnected from the target systems FIG. 26 illustrates the format of a continuous background data transfer. Unlike burst background data transfers, continuous background data transfers do not have any header information, and the data is simply a two-bit payload, although it is intended that the present disclosure encompass any size payload for continuous background data transfers. Continuous background data transfers are ended using the end of transfer escape sequence previously described. Because continuous background data transfers do not use headers, stalls and delays are not supported during these transfers. As a result, at least some of the preferred embodiments will force a selected continuous background data transfer to be executed as a burst background data transfer if the format in effect upon activation of the background data transfer requires scan stalls. Burst background data transfers will also be forced if the target system is the source of the clock, and also if the scan packets are configured with delays between packets.

The cJTAG adapters of at least some preferred embodiments are also capable of supporting non-scan data transfers between the debug test system and one or more target systems using non-cJTAG hardware and protocols incorporated into the cJTAG adapters. As shown in FIGS. 28 and 29, these custom data transfers (CDX) are similar to background data transfers, differing only by the inclusion of an extra bit preceding each of the burst payload packets and the first continuous payload packet. This extra bit is always a one and accounts for the case where neither the CDX hardware of the debug test system, nor of any the target systems, starts to transfer data after activation of the continuous data transfer. The system recovers in a manner similar to the TMS signal disconnect case described above for background data transfers. In all other respects continuous data transfers operate in the same manner as background data transfers. As with BDX transfers, other preferred embodiments of CDX transfers may use advanced mode packets (e.g., MScans and OScans) in place of the headers illustrated in FIG. 28.

The cJTAG architecture has the added capability of configuring parts of the cJTAG interface of the target system to be powered-down under selected conditions. FIG. 30 illustrates some of the conditions under which such a power-down is allowed by at least some of the preferred embodiments. Four power-down modes are defined and the power-down mode is selected either at power-on reset or after power-on reset by reprogramming the adapter using a software command. The four modes include not permitting a power-down when requested (mode 0) regardless of mode, permitting a power-down when requested if the state machine of the target system cJTAG TAP is in the test logic reset ("TLR") state (mode 1) while in standard mode, permitting a power-down if the state machine of the target system cJTAG TAP is in the test logic reset state while in standard mode and there has been no link clock (TCK) activity for more than 1 millisecond (mode 2), and permitting a power-down based only on the lack of a link clock for more than 1 millisecond in both standard and advanced mode (mode 3). Although the preferred embodiment shown in FIG. 30 uses a 1 millisecond inactivity period, other inactivity periods are possible and are intended to be within the scope of the present disclosure.

Mode 0 and mode 1 operate in an "affirmative response" ("AR") model. Both modes involve a requested operation while the link clock is up and running. The request originates from logic external to the TS cJTAG adapter and is referred to as the Power and Reset Controller ("PRC"). As shown in FIG.

31, the PRC asserts synchronized power-down request 8030 when the PRC is in mode 1 (power-down is not permitted in mode 0). After the TS TAP indicates that it has entered into the test logic reset state (TLR TAP state signal 8040 asserted) while in standard mode, and indicates that TMS has been asserted (TMS force 8050), the TS cJTAG adapter performs an orderly shutdown of the cJTAG interface (indicated by PD state 8060), halts the JTAG clock 8020, and acknowledges the power-down request (PD_ACK 8070).

Mode 2 and mode 3 operate in a "non-response" ("NR") model. As shown in FIG. 32, in these modes of operation the PRC generates an event that may generate a power-down acknowledge. If a power-down acknowledge is generated, the TS cJTAG adapter must negate the power-down acknowledge within the inactivity period. In the preferred embodiment of FIG. 32, the TS cJTAG adapter periodically toggles the power-down acknowledge 8120 at an interval that is half the duration of the time base 8110. The time base has a period that is equal to the inactivity period. Periodically toggling the power-down acknowledge 8120 acts as a "keep alive" heartbeat that prevents the PRC from powering down the TS cJTAG adapter. If the acknowledge does not negate the state of the power-down acknowledge within the inactivity period, the sampled power-down acknowledge 8130 will remain at the same state for a period of time exceeding the inactivity timeout, and the power down will be allowed at that point if Mode 3 is enabled. In Mode 2 the power down will not be allowed unless the TS TAP has entered the test logic reset state while in standard mode. Thus, only Mode 3 is available to allow a power down while in advanced mode, which will occur if the power-down acknowledge stops sequencing for a period of time longer than the inactivity period. This may happen, for example, if the target systems becomes disconnected from the debug and test system (if the clock is driven by the debug and test system), which results in a return to the test logic reset state, where the TAP remains due to the TMSC signal (and as a result the TMS bit) being pulled up and held to a logical one. Once the TAP has remained in the test logic reset state for more than the inactivity period, the power down is allowed.

In at least some preferred embodiments, a distinction is made when a TAP state machine is in the test logic reset state of FIG. 4 while in advanced mode, as opposed to IEEE mode. In such preferred embodiments, it is desirable to sometimes prevent a reset and a transition to IEEE mode from occurring while holding the TAP state machine in the test logic reset state in advanced mode, while at other times allowing the transition to IEEE mode whenever the TAP state machine is held in the test logic reset state in advanced mode. To make such a selection of behavior possible, at least some preferred embodiments are configured to change behavior in this manner based upon a pre-selected sequence of TMS bits.

After reaching the test logic reset state, if the TMS bit is low in two successive packets in advanced mode while in the test logic reset state, the TAP state machine transitions to the run test idle state, where it then remains, still in advanced mode, as long as the TMS bit is low. If the TMS bit is high in one packet of a two packet set, and low in the other packet of the two packet set, the TAP state machine will remain in the test logic reset state for each test logic reset state where this conditions is true, also remaining in advanced mode. But if the TMS bit is held high for two successive packets, the sequence is treated as a special or abnormal sequence, causing a hard reset to be generated and forcing the system 1000 to revert to IEEE mode after completion of the reset.

Although two successive logical "1" values of the TMS bit are used in the preferred embodiment described, other values, bits, and sequences may become apparent to those skilled in the art, and all such values, bits, and sequences are intended to be within the scope of the present disclosure. Further, although the present disclosure describes a preferred embodiment that returns to the IEEE mode by default upon reset, other modes may be selected as a default mode as previously described with regard to configuring the system 1000 upon power-on reset, and all such default mode configurations are also intended to be within the scope of the present disclosure.

It is possible that system operation may be changed or corrupted by a make or break in the connection of a debug test system and target system. In accordance with at least some preferred embodiments of the invention, a "firewall" is implemented to reduce the chance that system operation is changed or corrupted by a make or break in the connection of a debug test system and target system in a mix of powered and un-powered configurations. The term firewall, as used in the present disclosure, is intended to refer to a mechanism by which a clock that drives a TAP state machine is gated by a control signal, allowing the state machine to be disabled and thus protected from bit transitions on other signals caused by the make or break in the connection as described above. When either a debug and test system or a target system is firewalled, the TAP machine is frozen and cannot transition from state-to-state. Although the clock signal is gated in the preferred embodiments described, other signal may also be gated by a control signal as part of a firewall implementations, and all such implementations are intended to be within the scope of the present disclosure.

A firewall between the debug test system and target system interfaces may be created at power-on reset (POR) or under the direction of the debug test system. As already noted, the firewall blocks the TCK signal to the target system TAPs attached to the cJTAG interface which prevents the TAP from advancing. The firewall may be raised and lowered within a command window. The firewall may easily be removed by standard scan sequences after POR prior to any determination of the configuration or topography of the system 1000 of FIG. 1. The firewall may also be removed prior to performing any other action such as obtaining the device ID with the IDCODE instruction created by the TLR TAP state. Commands within a command window change register values controlling the firewall. Changes in the state of the firewall take effect when the system TAP state reaches the IDLE state in at least some preferred embodiments. Other states or state sequences may be implemented to allow changes in the state of the firewall, and all such implementations are intended to be within the scope of the present disclosure.

Devices that implement a firewall are entirely compatible with those that do not implement a firewall as the firewall enables the global bypass provided by the global bypass bit in addition to disabling the clock that advances the state of the of the TAP state machine connected to the cJTAG interface. This is accomplished using a command window sequence, which is ignored by both JTAG devices, as well as cJTAG devices that do not implement a firewall. JTAG devices treat the command window as an inert state sequence and are not affected or modified by the sequence. JTAG or cJTAG devices that do not implement a firewall do not include the firewall control register being modified while the command window is open, and thus will also not be affected by the sequence cJTAG devices that implement a firewall but have the firewall lowered at power-on reset are likewise unaffected by the sequence. This makes both firewalled and non-firewalled operation entirely compatible with systems using the JTAG protocol.

At least some of the preferred embodiments of the invention provide for orderly behavior in the event of a break in the electrical connection between the debug and test system and the target system (e.g., if the cable is disconnected). This behavior creates device operation like that created by a power-on reset. Two connection breaks are possible: supervised or intentional breaks, and unsupervised or unintentional breaks. A supervised break is preceded by a command issued by a user of the debug and test system to prepare the system for a supervised break. Upon receipt of this command, the system will place the system in a state similar to the state that results from a power-on reset. Once in that state, the user is notified that the system is ready, allowing the user to then disconnect the debug and test system from the target system.

An unsupervised break is one not anticipated by the user (e.g., an accidental disconnect). In this case, the response depends on whether the target system or the debug and test system is supplying the TCK signal. In at least some preferred embodiments if, for example, the target system is supplying the TCK signal, the target system's TAP state machine transitions to the test logic reset state (FIG. 4) and the cJTAG adapter then powers down. If the debug and test signal supplies the TCK signal, in at least some of the preferred embodiments, the cJTAG adapter freezes (due to the lack of a clock signal) and if power down mode with no TCK is used, the PRC executed a power-on reset after no TCK time limit is exceeded. The BCE pin, which has a pull down connection, also goes low, which resets all test logic.

In at least some preferred embodiments where the TCK signal is provided by the target system, the negative of the TDI (nTDI) signal is used when the TDI bit is transmitted across the link. The use of nTDI assures a TDO value of "1" in shift states (i.e., the TMSC signal will have a value of "1"). The control states generate a TDO bit value of "1" in non-shift state (i.e., the TMSC signal will again have a value of "1"). As a result of the TMSC signal (and thus the TMS bit) begin held at a logical value of "1," the TAP state machine transitions to the test logic reset state. When at the test logic reset state, the cJTAG adapter detects two TMS bit values of "1" which, as previously described, then causes a reset. At this point, the cJTAG adapter is back in the IEEE mode with the TAP state machine state at test logic reset. The reset initializes the power down mode to the default power-on reset values for the cJTAG adapter and permits power down if the mode so allows.

As already noted, scan formats (such as the OSCAN formats of FIGS. 12A and 12B) are defined within at least some preferred embodiments that optimize the data transferred by reducing duplicative information, or by eliminating information that is not needed for a specific transfer. In at least some preferred embodiments, further optimizations and improvements in the performance of the data transfers between debug and test system 1100 and target system 1200 (FIG. 1) are accomplished through the use of segmented scan formats (SSCANs), illustrated in FIG. 33. The segmented scan formats shown allow, among other things, for selective reduction of the number of transmitted bits that identify the type of data contained within different segments within a segmented scan. Each segmented scan is divided into control and data segments, wherein a segment is defined as a group of scan packets. Control segments include scan packets associated with non-shift TAP states, and data segments include scan packets associated with shift TAP states. Each data segment is preceded by a header that identifies the type of data within the data segment, and the last data segment before a subsequent control segment is followed by a header that identifies the subsequent segment as a control segment. Thus, the first control segment, transmitted upon entry into a mode of operation supporting segmented scans, is not preceded by a header.

Figure 33A:
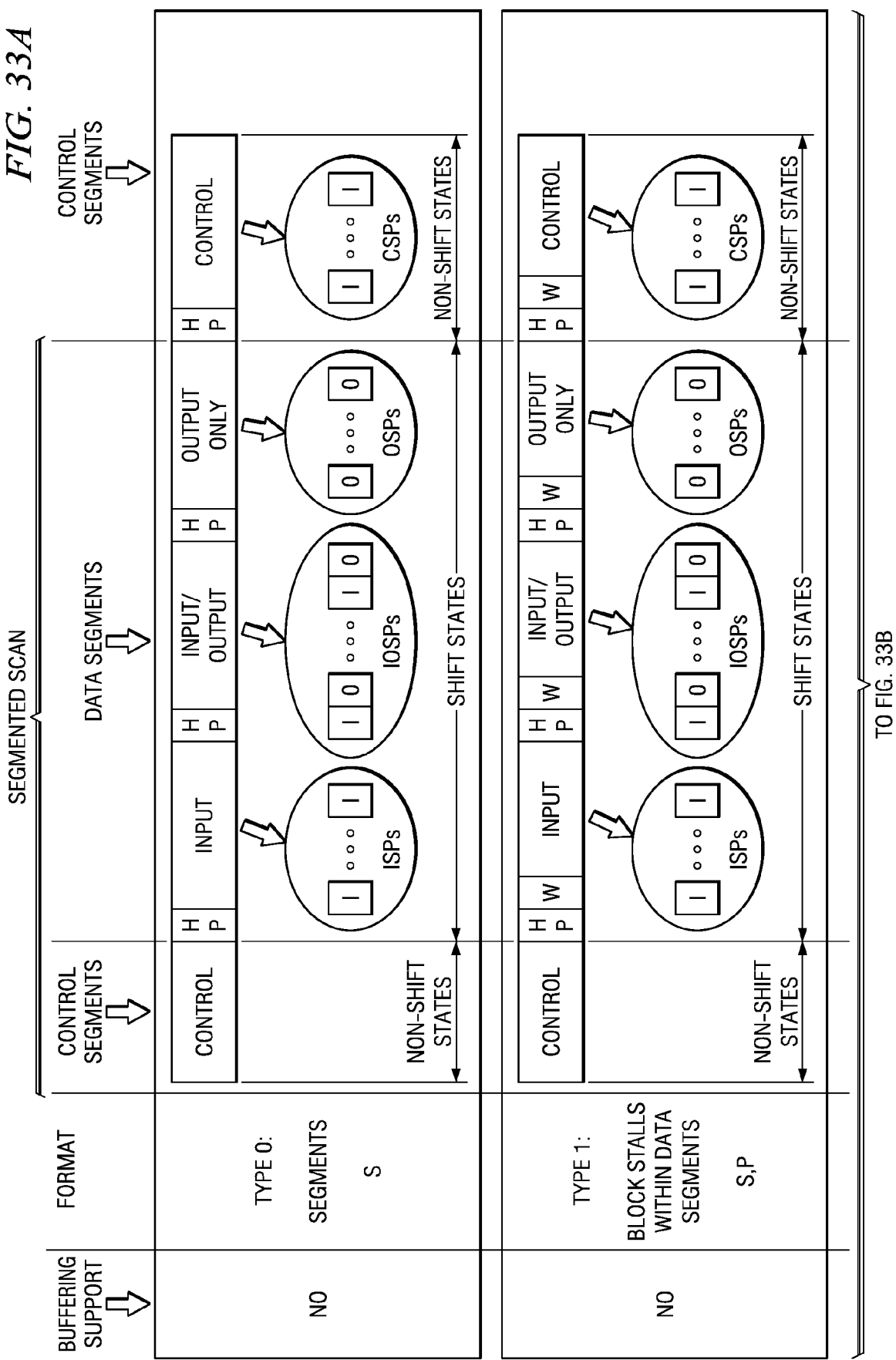
FIG. 33 illustrates examples of several different segmented scan message formats in accordance with at least some preferred embodiments.
Figure 33B:
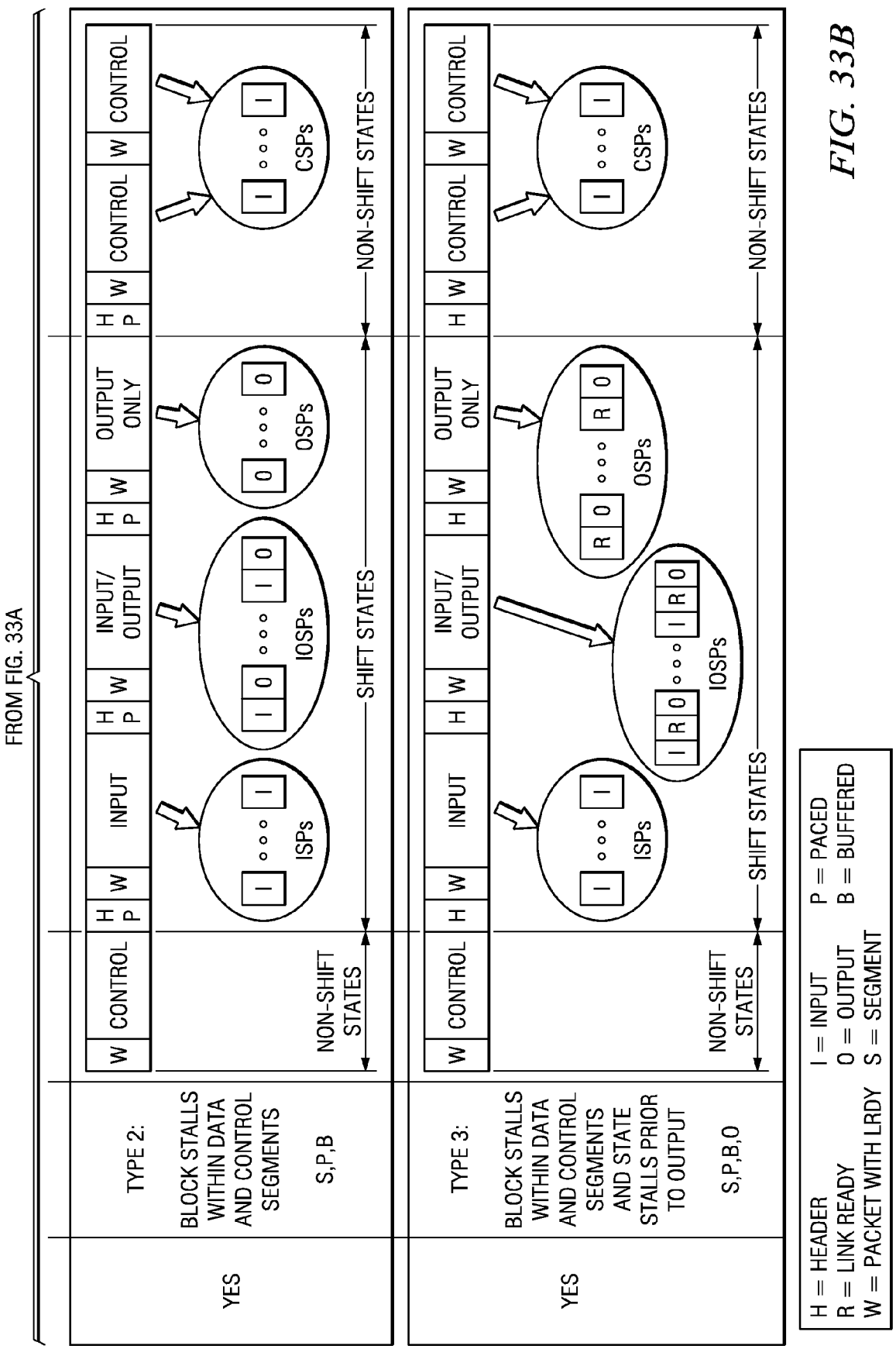

In at least some preferred embodiments, data segments are defined, as shown in FIG. 33, that include groups of input scan packets (ISPs) with only TDI bit data (data transferred from debug and test system 1100 to target system 1200 of FIG. 1), groups of output scan packets (OSPs) with only TDO bit data (data transferred from target system 1200 to debug and test system 1100), and groups of input/output scan packets (IOSPs) with both TDI and TDO bit data. The header preceding each segment indicates the type of scan packets that are included within the segment (all of the same type within a segment). When a header indicates that the following segment contains scan packets associated with a non-shift TAP state (i.e., a control segment), the TAP state machine exist the shift state (associated with the scan packets of the data segment), and the TAP state machine progresses according to the TMS values in the subsequent control scan packets (CSPS) within the control segment.

Ready bits may also be embedded in scan packets within the data segment of the preferred embodiment of FIG. 33, to allow for buffered data exchanges and data exchanges between devices that communicate at different rates. In at least some preferred embodiments, data is transmitted at one data rate and stored in a buffer, then read out of the buffer at a second data rate. The ready bit is used to hold off the device filling the buffer, and thus control the rate at which the buffer is filled on a scan packet by scan packet basis. In other preferred embodiments, ready bits are only included in the first scan packet within a segment (data and/or control), thus providing a block-oriented or segment by segment flow control. Other configurations for inclusion of a ready bit within different scan packets will become apparent to those skilled in the art, and all such configurations are intended to be within the scope of the present disclosure.

The preferred embodiment of FIG. 33 illustrates four segmented scan format examples, types 0 through 3. SSCAN type 0 includes a control segment followed by one or more data segments that are each preceded by a header packet (HPs). Because SSCAN type 0 does not use any ready bits, the control segment only includes TMS data. Likewise, input only scan packets only include TDI bit data, output only scan packets only include TDO bit data, and input/output scan packets only include TDI and TDO bit data. As previously noted, a header packet precedes each data segment. The control scan packets within the control segment following the data segments are preceded by a header packet indicative of the transition from data scan packets to control scan packets (i.e., from a shift state to a non-shift state). Because there are no ready bits or other delay and/or pacing mechanisms used within the SSCAN type 0 format, the control segments and the data segments are all transferred at the TCK clock rate. The last data scan packet within the data segment is identified by using an end-of-transfer escape sequence (previously described).

Figure 34:
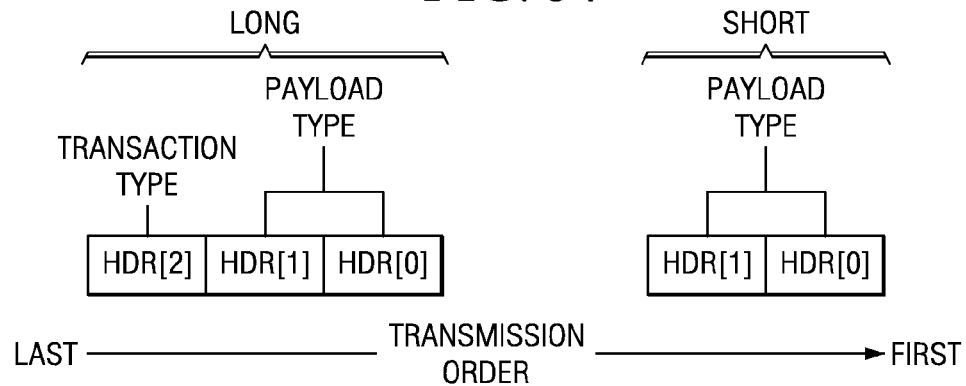
FIG. 34 illustrates different header formats usable within a segmented scan message in accordance with at least some preferred embodiments.

FIG. 34 illustrates the various formats for the header packets that are used in at least some preferred embodiments. Either a 3-bit (long) or a 2-bit (short) header packet is used, wherein the 3-bit header packet precedes the first data segment, and the 2-bit header precedes all other segments (data and control, except the control segment preceding the first data segment), within a given segmented scan cycle. The two least significant bits of both header packets (bits 1 and 0) determine the payload type, and the most significant bit of the 3-bit header packet determines the transaction type. The payload type may indicate input data only, output data only, both input and output data, or control information (used to indicate a transition from the data segment to the next control segment; the transition from a control segment to a data segment is generated automatically when the TAP transitions from a non-shift state to a shift state). The transaction type may be type A or type B, wherein type A provides some transaction stalling capabilities (between segments) or no stalling at all, and type B always provides transaction stalling capabilities (both between segments and within segments). The following table shows header values and their meaning, as used in at least some preferred embodiments:

TABLE 1

| Header Bits [2:0] | After Data Packets | Payload | Transaction Type | Description |
|---|---|---|---|---|
| 000 | — | Input & Output | A | Input and output scan packets |
| 001 | — | Output Only | A | Output only scan packets |
| 010 | — | Input Only | A | Input only scan packets |
| 011 | No | Input Only | A | Input only scan packets |
| 011 | Yes | Control | — | Control scan packets, exit TAP shift state |
| 100 | — | Input & Output | B | Input and output scan packets |
| 101 | — | Output Only | B | Output only scan packets |
| 110 | — | Input Only | B | Input only scan packets |
| 111 | No | Input Only | B | Input only scan packets |
| 111 | Yes | Control | — | Control scan packets, exit TAP shift state |

Figure 35:
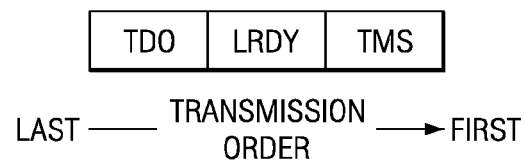
FIG. 35 illustrates a wait packet format usable within a control segment in accordance with at least some preferred embodiments.
Figure 36:
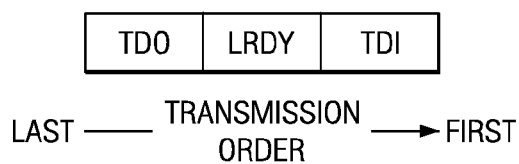
FIG. 36 illustrates a wait packet format usable within a data segment in accordance with at least some preferred embodiments.

Referring again to FIG. 33, SSCAN type 1 includes a control segment followed by one or more data segments that each includes a wait packet (W) and data scan packets, wherein each data segment is preceded by a header packet. Like SSCAN type 0, SSCAN type 1 does not use any ready bits within the first control segment, and thus the first control segment only includes TMS data. But unlike SSCAN type 0, SSCAN type 1 does use ready bits within wait packets within each data segment and each control segment after the first data segment. The wait packets within the control segment are control scan packets with both a ready bit and TDO bit data included as shown in FIG. 35. The wait packets within the data segments are data packets with an additional ready bit. Referring to FIG. 36, for all three types of data packets (input only, output only, and input/output) the wait packet of segment is the first data scan packet of the segment and includes TDI bit data, followed by a ready bit, followed by TDO bit data. The remaining data scan packets only include data corresponding to the type of data scan packets within the segment. Thus, within an input only segment, the input scan packets after the wait packet only include TDI bit data. Likewise, within an output only segment, the output scan packets after the wait packet only include TDO bit data. In an input/output segment, the input/output scan packets after the wait packet only include TDI and TDO bit data.

Referring again to the preferred embodiment of FIG. 33, a header packet precedes each segment, and each segment includes a wait packet. A control segment follows the data segments, and the control segment is also preceded by a header packet and also includes a wait packet as shown. Although the wait packets provide a stall before the transfer of each group of data scan packets and before the transfer of the control scan packets of the control segment following the data segments (allowing the transfers to be paced), each of the transfers still take place at the TCK clock rate. As with SSCAN type 0, the last data scan packet of the data segment is identified by using an end-of-transfer escape sequence.

Continuing to refer to FIG. 33, SSCAN type 2 begins with a control segment that includes a wait packet at the beginning of the segment. The control segment is followed by one or more data segments that each includes input only scan packets, output only scan packets, and/or input/output data packets. The input only scan packets include both TDI bit data (data transferred from debug and test system 1100 to target system 1200 of FIG. 1) and an end bit in each packet. The output only scan packets include both TDO bit data (data transferred from target system 1200 to debug and test system 1100) and an end bit in each packet. The input/output scan packets include TDI and TDO bit data (data transferred both to and from debug and test system 1100, and to and from target system 1200), as well as an end bit in each packet. A header packet precedes each data segment, and each data segment includes a wait packet. A control segment follows the data segments, and the control segment is preceded by a single header packet. Each control segment includes a wait packet. Although the various wait packets provide a stall before the transfer of each group of control and data packets, each of the transfers still takes place at the TCK clock rate. This allows input buffering of both control and data segments, wherein a buffer can be filled at the TCK rate and then held off by a stall while a segment is being processed. Once the segment is processed, a data transfer in the opposite direction can begin, triggered as a result, for example, of the processing performed on the previous segment The last data scan packet of the data segment is identified by asserting the end bit within the last data scan packet.

Referring again to the preferred embodiment of FIG. 33, SSCAN type 3 is identical to SSCAN type 2, except that the output only scan packets and input/output scan packets within the corresponding data segments also each includes a ready bit, allowing scan stalls during the transfer of both types of data packets. All of the data scan packets are formatted according to one of the wait packet formats illustrated in FIG. 36. By using ready bits in each data scan packet (for output and input/output scan packets), data can be loaded into a buffer at the TCK clock rate, and subsequently read out at a rate controlled by the test system TAP 1210 (FIG. 1). Input only transfers continue to be performed at the TCK clock rate in the same manner as with SSCAN type 2.

As with optimized scans (OSCANs), if a segmented scan is selected that conflicts with the current clock source configuration of the debug and test system 1100 and target system 1200, a segmented scan that is consistent with the clock source configuration may be automatically selected. In at least some preferred embodiments, if the target system is configured to provide the clock source of the test interface (TCK in FIG. 1), and if automatic selection of a consistent format is enabled (referred to as format "aliasing"), the selection of a format that requires that the debug and test system source the clock is automatically overridden, and another format is selected. Thus, for example, if SSCAN type 0 is selected, wherein the debug and test system must source the interface clock, and the target system is configured to source the clock, the transaction will be executed using SSCAN type 2 instead of SSCAN type 0. Likewise, if SSCAN type 1 is selected with an incompatible clock source selection, SSCAN type 3 will automatically be selected as the format used for the transaction.

The above disclosure is meant to be illustrative of the principles and various embodiments of the present invention. Numerous variations and modifications will become apparent to those skilled in the art. It is intended that the disclosure, including the claims, be interpreted to embrace all such variations and modifications.

What is claimed is:

1. A process of communication in an integrated circuit comprising:
   A. receiving a first control segment formed of a group of scan packets with no header portion;
   B. then receiving data segments formed of groups of scan packets, each data segment including a header portion and a data portion; and
   C. then receiving a second control segment formed of a group of scan packets, the second control segment including a header portion and a control portion.

2. The process of claim 1 including receiving the control segments and the data segments in an integrated circuit that includes TAP state machine circuitry.

3. The process of claim 1 in which the receiving data segments includes receiving in the header portions the type of input and output data in the data portions.

4. The process of claim 1 in which the receiving data segments formed of groups of scan packets includes receiving serial binary bits representing information.

* * * * *